United States Patent
Hardin et al.

(10) Patent No.: US 9,070,811 B2
(45) Date of Patent: Jun. 30, 2015

(54) MULTI-CRYSTALLINE II-VI BASED MULTIJUNCTION SOLAR CELLS AND MODULES

(71) Applicant: PLANT PV, Inc., Oakland, CA (US)

(72) Inventors: Brian E Hardin, Berkeley, CA (US); Stephen T Connor, San Francisco, CA (US); James R Groves, Sunnyvale, CA (US); Craig H Peters, Oakland, CA (US)

(73) Assignee: PLANT PV, Inc., Belmont, CA (US)

( * ) Notice: Subject to any disclaimer, the term of this patent is extended or adjusted under 35 U.S.C. 154(b) by 0 days.

(21) Appl. No.: 13/750,756

(22) Filed: Jan. 25, 2013

(65) Prior Publication Data
US 2013/0192656 A1    Aug. 1, 2013

Related U.S. Application Data

(60) Provisional application No. 61/591,663, filed on Jan. 27, 2012.

(51) Int. Cl.
| | | |
|---|---|---|
| H01L 31/00 | (2006.01) | |
| H01L 31/078 | (2012.01) | |
| H01L 31/0725 | (2012.01) | |
| H01L 31/042 | (2014.01) | |
| H01L 31/18 | (2006.01) | |
| H01L 31/0236 | (2006.01) | |

(Continued)

(52) U.S. Cl.
CPC .......... *H01L 31/078* (2013.01); *H01L 31/0725* (2013.01); *H01L 31/042* (2013.01); *Y02E 10/52* (2013.01); *H01L 31/1836* (2013.01); *H01L 31/02363* (2013.01); *H01L 31/0368* (2013.01); *H01L 31/048* (2013.01); *H01L 31/0687* (2013.01); *H01L 31/054* (2014.12); *H01L 31/0445* (2014.12)

(58) Field of Classification Search
CPC .............. H01L 31/078; H01L 31/0725; H01L 31/1828; H01L 31/1836
USPC .................................................. 136/255, 260
See application file for complete search history.

(56) References Cited

U.S. PATENT DOCUMENTS

| | | |
|---|---|---|
| 4,680,422 A | 7/1987 | Stanbery |
| 4,753,684 A | 6/1988 | Ondris et al. |

(Continued)

FOREIGN PATENT DOCUMENTS

| | | | |
|---|---|---|---|
| JP | 09-237907 | * | 9/1997 |
| WO | WO 2011/036458 | * | 3/2011 |
| WO | WO-2013158177 A2 | | 10/2013 |

OTHER PUBLICATIONS

Machine translation of JP09-237907, pub. Sep. 1997.*

(Continued)

*Primary Examiner* — Allison Bourke
(74) *Attorney, Agent, or Firm* — R'Sue Popowich Caron

(57) ABSTRACT

Multi-crystalline group II-VI solar cells and methods for fabrication of same are disclosed herein. A multi-crystalline group II-VI solar cell includes a first photovoltaic sub-cell comprising silicon, a tunnel junction, and a multi-crystalline second photovoltaic sub-cell. A plurality of the multi-crystalline group II-VI solar cells can be interconnected to form low cost, high throughput flat panel, low light concentration, and/or medium light concentration photovoltaic modules or devices.

17 Claims, 12 Drawing Sheets

(51) Int. Cl.
*H01L 31/0368* (2006.01)
*H01L 31/048* (2014.01)
*H01L 31/0687* (2012.01)
*H01L 31/054* (2014.01)
*H01L 31/0445* (2014.01)

(56) References Cited

U.S. PATENT DOCUMENTS

| | | | |
|---|---|---|---|
| 5,009,719 | A | 4/1991 | Yoshida |
| 5,409,550 | A | 4/1995 | Safir |
| 5,520,747 | A | 5/1996 | Marks |
| 5,730,808 | A | 3/1998 | Yang et al. |
| 6,419,742 | B1 | 7/2002 | Kirk et al. |
| 7,297,865 | B2 | 11/2007 | Terao et al. |
| 7,569,764 | B2 | 8/2009 | Shan et al. |
| 7,672,549 | B2 | 3/2010 | Ghosh et al. |
| 7,872,192 | B1 | 1/2011 | Fraas et al. |
| 2002/0011263 | A1* | 1/2002 | Muramoto et al. ........... 136/255 |
| 2007/0193620 | A1 | 8/2007 | Hines et al. |
| 2009/0188563 | A1 | 7/2009 | Gibson et al. |
| 2009/0242029 | A1* | 10/2009 | Paulson et al. ................ 136/260 |
| 2010/0012188 | A1* | 1/2010 | Garnett ........................ 136/260 |
| 2010/0096001 | A1 | 4/2010 | Sivananthan et al. |
| 2010/0206352 | A1 | 8/2010 | Gee et al. |
| 2010/0282316 | A1 | 11/2010 | Gibson et al. |
| 2010/0288332 | A1 | 11/2010 | O'Neill |
| 2011/0067752 | A1 | 3/2011 | Fafard |
| 2011/0139227 | A1 | 6/2011 | Sivananthan et al. |
| 2011/0151616 | A1 | 6/2011 | Sivananthan et al. |
| 2011/0265865 | A1* | 11/2011 | Korevaar ...................... 136/255 |
| 2013/0081670 | A1* | 4/2013 | Ashley et al. ................. 136/246 |

OTHER PUBLICATIONS

Aneva et al. "Electronic defects in cdse nanocrystals embedded in GeS2 amorphous matrix", Journal of optoelectronics and advanced materials, vol. 7, No. 3, Jun. 2005, p. 1377-1382.*

Carmody, M., et al., "Single-crystal II-VI on Si single-junction and tandem solar cells", Applied Physics Letters 96, 153502, (Apr. 12, 2010), 1-3.

Green, Martin A., et al., "Solar cell efficiency tables (version 37)", Progress in Photovoltaics: Research and Applications, (Oct. 12, 2010), 84-92.

Xu, Dong, et al., "Proposed monolithic triple-junction solar cell structures with the potential for ultrahigh efficiencies using II-VI alloys and silicon substrates", Applied Physics Letters 96, 073508, (Feb. 19, 2010), 1-3.

K. Sarmah, et al, "Photoelectronic properties of thermally evaporated CdSe thin films," Optoelectronics and Advanced Materials—Rapid Communications vol. 2, No. 11, Nov. 2008, p. 721-725.

Woods, et al, "Electrical Characterization of CdTe Grain-Boundary Properties From as Processed CdTe/CdS Solar Cells," presented at the 2nd World Conference and Exhibition on Photovoltaic Solar Energy Conversion; Jul. 6-10, 1998; Vienna, Austria.

* cited by examiner

MULTI-CRYSTALLINE II-VI BASED MULTIJUNCTION SOLAR CELLS AND MODULES

CROSS-REFERENCE TO RELATED APPLICATIONS

This application claims priority to U.S. Provisional Patent Application No. 61/591,663 filed Jan. 27, 2012 entitled "Multi-Crystalline II-VI Based Multijunction Solar Cells," the content of which is incorporated herein by reference in its entirety.

GOVERNMENT SPONSORSHIP

This invention was made with Government support under contract number DE-EE0005332 awarded by the Department of Energy. The Government has certain rights to this invention.

FIELD

The described embodiments relate to solar cells and modules, and more particularly to monolithically integrated tandem solar cells and modules comprised of multi-crystalline group II-VI thin films and silicon semiconducting layers for flat panel (1× sun concentration), low light concentration (2-10× sun concentration), and/or medium concentration (10-50× sun concentration) photovoltaic (PV) cell modules.

BACKGROUND

Low cost, efficient photovoltaic (PV) modules are desirable to compete with fossil fuel based power production technologies. Multijunction solar cells are a pathway to produce PV-devices with high power conversion efficiencies for both terrestrial and space applications.

Low cost, high throughput processing techniques are desired in order to produce multijunction solar cells at lower costs. It is also desirable to fabricate multijunction solar cells with high power conversion efficiencies (for example, greater than 18%) in order to increase the areal power density of photovoltaic arrays and reduce installation costs.

BRIEF SUMMARY

Example embodiments of monolithically integrated multi junction solar cells comprise wide band gap, multi-crystalline, II-VI materials as the top sub-cell and silicon based bottom sub-cell, and which may be used to produce highly efficient PV modules at low cost are disclosed herein. In example embodiments, the II-VI materials may include groups consisting of and alloys of one or more of ZnTe, ZnSe, CdSe, CdTe, MgSe, and MgTe. Multi-crystalline II-VI materials can be deposited on silicon using a variety of low cost, high throughput production methods such as closed-space sublimation, physical vapor transport, and sputter deposition in example embodiments. In example embodiments, the multi-crystalline II-VI thin films may have a thickness in the range of 50 nm to 10 μm or any range subsumed therein, and may be deposited with a preferential crystal orientation. In example embodiments, the in-plane crystal orientation of the multi-crystalline II-VI thin films may result in a Gaussian distribution with a full width half maximum in the range of 0.04° to 60° or any range subsumed therein. For example, the full width half maximum may be 0.04°, 1°, 10°, 45°, or 60°. In example embodiments, the out-of-plane crystal orientation may be characterized by a texture component, $C_{hkl}$, that is greater than 0.3*n, where n is the total number of out-of-plane peaks. For example, the texture component, $C_{hkl}$, may be greater than 0.5*n or may be greater than 0.8*n in some embodiments. Multi-crystalline II-VI thin films may also be deposited with uneven top surfaces in example embodiments, which increases light scattering and improves light harvesting. In some example embodiments, the root mean square roughness factor for the multi-crystalline II-VI thin films may be in the range of 1% to 20% (or any range subsumed therein). In example embodiments, the root mean square roughness factor may be at least 1%, 5%, 10%, 15%, or 20%.

Example production techniques result in multi-crystalline thin films with higher defect densities and greater number of grain boundaries compared to single crystal films. In example embodiments, the multi-crystalline II-VI thin films may have a defect density in the range of $10^5$ $cm^{-2}$ to $10^{10}$ $cm^{-2}$ (or any range subsumed therein). For example, the defect density may be in the range of $10^6$ $cm^{-2}$ to $10^9$ $cm^{-2}$ or in the range of $10^6$ $cm^{-2}$ to $10^8$ $cm^{-2}$. In example embodiments, the multi-crystalline II-VI thin films may have lateral grain sizes in the range of 1 μm to 500 μm or any range subsumed therein. In example embodiments, the lateral grain size may be in the range of 1 μm to 100 μm (or any range subsumed therein) or in the range of 3-20 μm (or any range subsumed therein).

Example embodiments may also include a tunnel junction that includes a single crystal or multi-crystalline II-VI thin film.

In some example embodiments, solar cells as described herein may be used to provide high power conversion efficiency (for example, in the range of between 19-27%) at low cost for use in solar cell modules. In example embodiments, multi-crystalline II-VI/Si based multijunction solar cells may be used in flat panel (one sun), low, and/or medium concentration modules. In some embodiments, the solar cells (and the multi-crystalline II-VI thin films deposited across the solar cells) may cover at least 50% of the aperture area of the module. In some examples, the coverage may be at least 75% or 90% or more of the aperture area of the module. In some examples, the modules may have an aperture area in the range of 2 to 50 square feet or any range subsumed therein and the area covered by the solar cells (and the multi-crystalline II-VI thin films deposited across the solar cells) in the module may be in the range of 1 to 25 square feet or any range subsumed therein. In some embodiments, the modules may include a concentrator providing light concentration in the range of 2× to 50× of the incident light or any range subsumed therein. For example, the concentrator may provide light concentration in the range of 2× to 10× or 10× to 50×. In example embodiments with light concentration, the solar cells (and the multi-crystalline II-VI thin films deposited across the solar cells) may cover greater than 2% of the module aperture area.

Example embodiments described herein also relate to the method of producing multi-crystalline II-VI photovoltaic sub-cells for II-VI/Si based multijunction solar cells and modules, including deposition of multi-crystalline II-VI thin films for solar cells using closed-space sublimation, physical vapor transport deposition, reactive sputtering, non-reactive sputtering, hot wall epitaxy, and co-evaporation.

Other features and aspects of the invention will become apparent from the following detailed description, taken in conjunction with the accompanying drawings which illustrate, by way of example, the features in accordance with embodiments.

BRIEF DESCRIPTION OF THE DRAWINGS

Embodiments of the invention may be better understood by reading the following detailed description of the example embodiments with reference to the accompanying drawings wherein.

DETAILED DESCRIPTION

Figure 1:
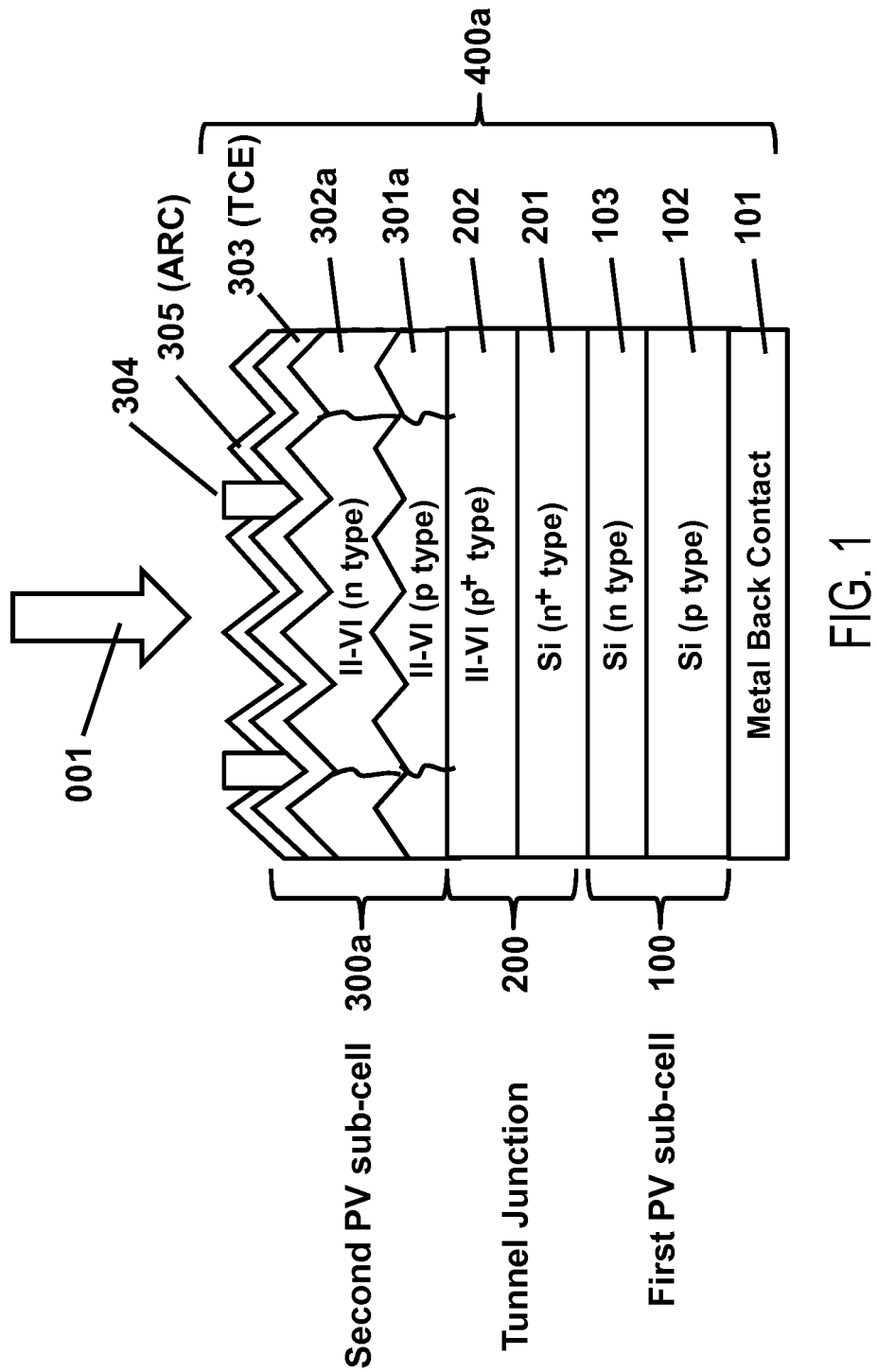
FIG. 1 illustrates a cross-sectional view of a monolithically integrated, multijunction solar cell showing a first photovoltaic sub-cell including single crystal silicon semiconductor layers with a p-type base and n-type emitter, a tunnel heterojunction including a single crystal $n^+$-type silicon layer and single crystal $p^+$-type group II-VI semiconductor layer, and a second photovoltaic sub-cell including multi-crystalline group II-VI semiconductor layers with a p-type base and n-type emitter according to an embodiment.

It will be appreciated that numerous specific details are set forth in order to provide a thorough understanding of the example embodiments described herein. However, it will be understood by those of ordinary skill in the art that the embodiments described herein may be practiced without these specific details. In other instances, well-known methods, procedures and components have not been described in detail as not to obscure the embodiments described herein. Furthermore, this description is not to be considered as limiting the scope of the embodiments described herein in any way, but rather as merely describing the implementation of the various embodiments described herein.

Multifunction Solar Cell Overview

Various embodiments of a monolithic, multijunction, multi-crystalline II-VI group based solar cell are described below. The solar cell includes, but is not limited to, a bottom (or back) electrical contact, a first photovoltaic (PV) sub-cell provided over the bottom electrical contact, a tunnel heterojunction provided over the first PV sub-cell, a second PV sub-cell provided over the tunnel heterojunction, and a top electrical contact provided over the second PV sub-cell. At least the second PV sub-cell comprises a multi-crystalline II-VI group based PV sub-cell including an emitter layer and a base layer. The tunnel heterojunction comprises a II-VI group based layer and a Si based layer. In some embodiments, one or both of the II-VI group based layer and the Si based layer can be a multi-crystalline or a single-crystalline structure. The first PV sub-cell comprises a Si based emitter and base layers. In some embodiments, the first PV sub-cell comprises a multi-crystalline or single-crystalline structure. The group II-VI semiconductor material is included in one or more of the first PV sub-cell, tunnel heterojunction, or second PV sub-cell and has, for example, a band gap greater than 1.5 eV.

Example embodiments of the multi-crystalline II-VI based solar cell may include a narrow band gap photovoltaic sub-cell (e.g., 0.9-1.2 eV) connected in series, through a tunnel junction, to a wide band gap photovoltaic sub-cell (e.g., 1.6-1.8 eV). In example embodiments, each photovoltaic sub-cell may be a p-n or n-p diode designed to absorb a different portion of the solar spectrum. In example embodiments, the wide band gap sub-cell absorbs the high energy photons (e.g., 350 nm-800 nm) and may include one or more layers of multi-crystalline, II-VI materials. In example embodiments, the low band gap sub-cell absorbs lower energy photons (e.g., 800-1200 nm). In example embodiments, the tunnel junction may be a highly doped n-p or p-n diode between the photovoltaic sub-cells. In example embodiments, the tunnel junction may exhibit nearly linear current-voltage characteristics near zero voltage bias and provide an ohmic contact between photovoltaic sub-cells.

The monolithic, multijunction, multi-crystalline II-VI group based solar cell serves as a building block from which flat panel modules (also referred to as flat panel devices or systems) can be fabricated. The number of solar cells included in a given module may be dictated by fabrication, performance, cost, and/or design requirements.

With reference to FIG. 1, in an example embodiment, there is provided a cross-sectional view of at least a portion of a monolithic, multijunction solar cell 400a comprised of a narrow band gap, silicon (Si) based photovoltaic sub-cell 100 (also referred to as a first PV sub-cell), a tunnel heterojunction 200 (also referred to as a tunnel junction), and a wide band gap, II-VI based photovoltaic sub-cell 300a (also referred to as a second PV sub-cell or second sub-cell). When incident light 001 is directed to the top of the multijunction solar cell 400a, photovoltaic sub-cell 300a absorbs the photons with energy greater than the band gap of the multi-crystalline, n-type emitter 302a and multi-crystalline, p-type base 301a layers. This allows lower energy photons (those with energy less than the band gap of the emitter 302a and base 301a layers) to pass through the tunnel junction 200, where photons above the band gap of the single crystal n-type emitter 103 and single crystal p-type base 102 layers are absorbed by the silicon based photovoltaic sub-cell 100. In this example, photocurrent travels in series through the II-VI based sub-cell 300a, tunnel junction 200, and the Si based sub-cell 100.

Silicon Based Photovoltaic Sub-Cell

With reference to FIG. 1, the first photovoltaic sub-cell 100 includes a single crystal p-type base layer 102, a single crystal n-type emitter layer 103, and a metal back contact 101. The p-type base layer 102 is comprised of a single crystal Si wafer that is typically doped during crystal growth. The underlying Si layer may also be comprised of thin silicon exfoliated from a wafer or cast by other means. A moderate to highly doped n-type emitter layer 103 is formed via diffusional doping, ion-implantation, or epitaxial growth. In an example embodiment, the metallic back contact 101 is comprised of aluminum (Al) and rear silver (Ag) tabbing layer that is deposited on the back surface of the p-type, group IV layer 102 prior to tunnel junction formation.

Tunnel Junction

In an example embodiment, the tunnel junction 200 is comprised of a highly doped n$^+$-type (e.g., $\geq 10^{18}$ cm$^{-3}$) Si layer 201 and a p-type doped II-VI layer 202. The n-type doped Si layer 201 is formed on Si emitter layer 103 via diffusional doping, ion-implantation, or epitaxial growth. The tunnel heterojunction 200 is completed by depositing a single crystal highly p$^+$-type doped (e.g., $\geq 10^{18}$ cm$^{-3}$) II-VI layer 202. Possible group II-VI materials include, but is not limited to ZnTe, ZnSe, CdSe, CdTe, MgSe, MgTe, or any alloy or combination of one or more of any of ZnTe, ZnSe, CdSe, CdTe, MgSe, and MgTe. The II-VI materials can be deposited using epitaxial methods such as molecular beam epitaxy, metal organic vapor phase epitaxy, atomic layer epitaxy, and liquid phase epitaxy to obtain a single crystalline II-VI thin film layer 202.

With reference to FIG. 1, there is provided a cross-sectional view of a portion of a photovoltaic cell 400a fabricated using the method of an example embodiment. The multi-crystalline II-VI photovoltaic sub-cell 300a is grown directly on the p$^+$-type II-VI tunnel heterojunction 200. In this embodiment, the II-VI photovoltaic sub-cell 300a is deposited using low cost deposition techniques such as closed-space sublimation. The p-type II-VI layer 301a can be comprised of ZnTe, ZnSe, CdSe, CdTe, MgSe, MgTe, or any alloy or combination of one or more of any of ZnTe, ZnSe, CdSe, CdTe, MgSe, and MgTe. As an example, CdSe thin films can be deposited in a closed-space sublimation chamber with a pressure ranging from $10^{-6}$ Torr to $2*10^{-1}$ Torr (or any range subsumed therein) in a nitrogen atmosphere with the CdSe source heated between 600-800° C. (or any range subsumed therein) and substrate heated to 250-680° C. (or any range subsumed therein). Other example ranges include, but are not limited to: for the pressure, $10^{-4}$ Torr to 10 Torr or $10^{-2}$ Torr to 10 Torr; for the source temperature, 600-750° C.; and for the substrate temperature, 300-500° C. Depositing II-VI materials (e.g., CdTe) on amorphous (e.g., glass) or nanocrystalline (e.g., CdS) layers via closed-space sublimation typically results in grain growth of 100 nm to 3 μm with slight or no preferential crystal orientation in-plane or out-of-plane relative to the substrate. However, deposition of II-VI materials on crystalline substrates (e.g., silicon wafers) with even a high degree of lattice mismatch can increase the lateral grain size (e.g., $\geq 5$ μm) and produce highly oriented crystallites, which results in multi-crystalline thin films with acceptable photovoltaic properties to produce a high open-circuit voltage.

Closed-space sublimation can be used to produce multi-crystalline layers defined as films with lateral grain sizes between 1 μm and 500 μm. Other example ranges for the lateral grain size include, but are not limited to, 1 μm to 100 μm and 5-30 μm. The in-plane crystal orientation results in a Gaussian distribution with a full width half maximum of 45°. In other examples, the full width half maximum may be in the range of 0.04° to 60° or any range subsumed therein. For example, the full width half maximum may be 0.04°, 1°, 10°, 45° or 60°. The out-of-plane orientation is typically defined by a texture component ($C_{hkl}$) based on the ratio of the highest peak intensity for a given hkl plane ($I_{hkl}$) versus randomly orientated intensity ($I_{random,hkl}$) at the same position versus the cumulative intensity from the total number out-of-plane peaks (n) measured using x-ray diffraction shown in the equation below.

$$C_{hkl} = \frac{\frac{I_{hkl}}{I_{random,hkl}}}{\frac{1}{n}\sum_n \frac{I_{hkl}}{I_{random,hkl}}}$$

Randomly oriented thin films have a $C_{hkl}$ value of 1, while completely oriented thin films have a $C_{hkl}$ value of n, where n is the total number of out-of-plane peaks. Multi-crystalline II-VI thin films in some embodiments are oriented with a texture component $C_{hkl} \geq 0.3*n$. In other example embodiments, the texture component, $C_{hkl}$, may be greater than $0.5*n$ or may be greater than $0.8*n$. The thickness of the II-VI thin film in example embodiments may be in the range of 50 nm to 10 μm (or any range subsumed therein), with a root mean square roughness factor of 20% of the film thickness. In some example embodiments, the root mean square roughness factor for the multi-crystalline II-VI thin films may be in the range of 5% to 20% (or any range subsumed therein). In some example embodiments, the root mean square roughness factor may be at least 1%, 5%, 10%, 15% or 20%. These rough II-VI films, which propagate throughout the subsequent layers as shown in FIG. 1, offer increased light scattering and thus improved light harvesting over single crystal films that can have a roughness of only a few atomic monolayers (e.g., <2 nm).

In example embodiments, the multi-crystalline II-VI thin films may have a defect density in the range of $10^5$ cm$^{-2}$ to $10^{10}$ cm$^{-2}$ (or any range subsumed therein). For example, the defect density may be in the range of $10^6$ cm$^{-2}$ to $10^9$ cm$^{-2}$ or may be in the range of $10^6$ cm$^{-2}$ to $10^8$ cm$^{-2}$. Layer thicknesses and alloying of the semiconductor layer that forms the sub-cell can be controlled and optimized by adjusting different raw material compositions, deposition rates, chamber pressure, substrate temperatures, and deposition time during growth to meet the requirements for photovoltaic sub-cells. P-type doping of $10^{15}$ cm$^{-3}$ to $10^{18}$ cm$^{-3}$ can be accomplished by varying the material composition (e.g., Cd poor or Se rich) or addition of dopants (e.g., nitrogen) during film growth. N-type doping of $10^{15}$ cm$^{-3}$ to $10^{19}$ cm$^{-3}$ can be accomplished by varying material composition (e.g., Cd rich or Se poor) or doping with the addition of indium either during film deposition or post-deposition where the dopant is evaporated on the surface and then annealed to diffuse into the layer.

Figure 2:
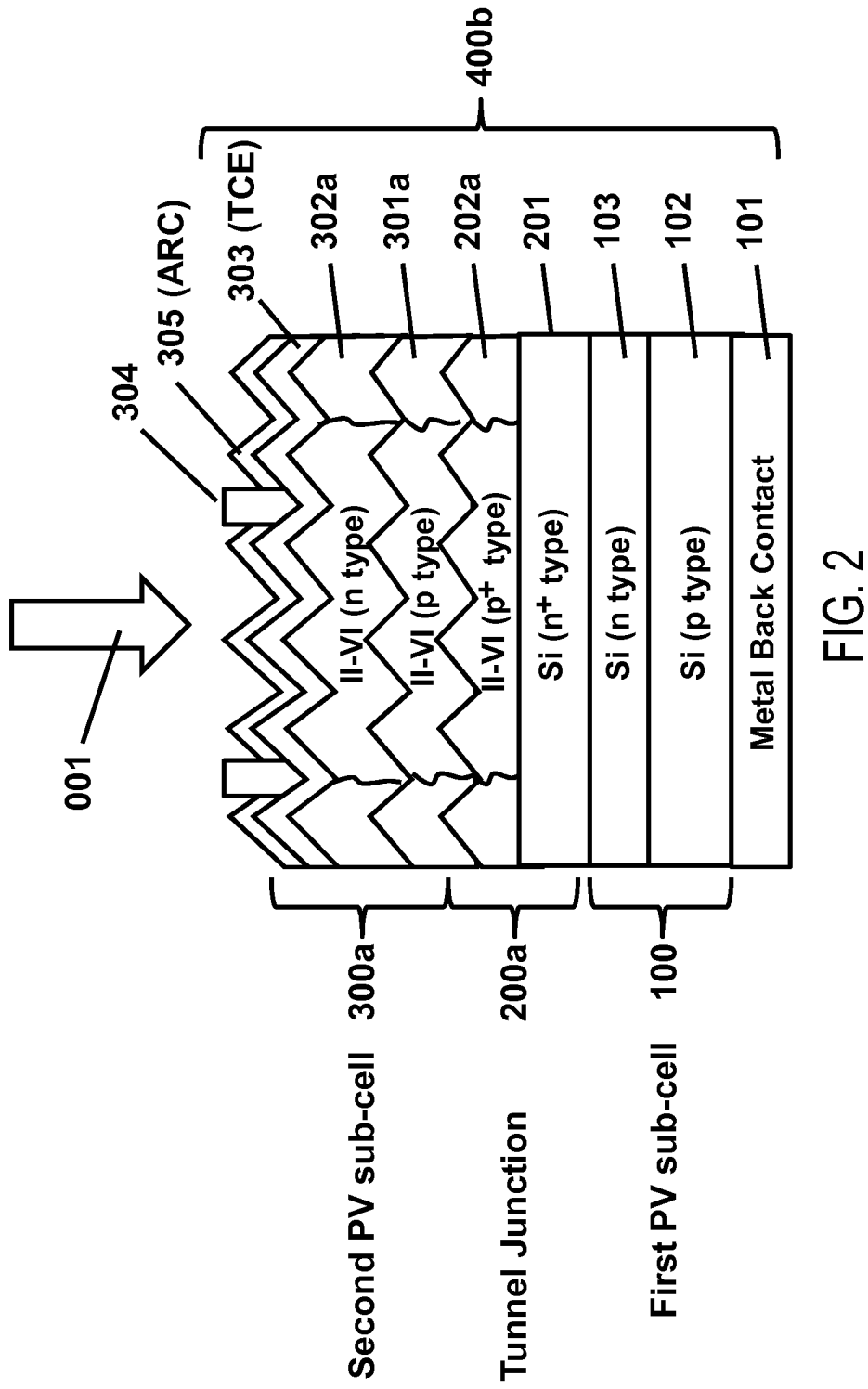
FIG. 2 illustrates a cross-sectional view of a monolithically integrated, multijunction solar cell showing the first photovoltaic sub-cell including single crystal silicon semiconductor layers with a p-type base and n-type emitter, the tunnel heterojunction comprised of a single crystal $n^+$-silicon layer and a multi-crystalline $p^+$-type group II-VI semiconductor layer with the second photovoltaic sub-cell including multi-crystalline group II-VI semiconductor layers with a p-type base and n-type emitter according to an alternative embodiment.

Reference is now made to FIG. 2, which illustrates a cell 400b in accordance with another embodiment of the multijunction solar cell. Cell 400b of FIG. 2 is a variant of the solar cell 400a of FIG. 1. In this embodiment, a multi-crystalline p$^+$-type doped II-VI layer 202a is deposited on a single crystal n$^+$-type group IV layer 201 to form the tunnel heterojunction 200a (also referred to a tunnel junction). The multi-crystalline II-VI layer 202a is deposited using closed space-sublimation. As an example, a ZnTe thin film can be deposited in a closed-space sublimation chamber with a pressure ranging from $10^{-6}$ Torr to 10 Torr (or any range subsumed therein) in a nitrogen atmosphere with the ZnTe source heated between 600-800° C. (or any range subsumed therein) and substrate heated to 250-680° C. (or any range subsumed therein). Other example ranges include, but are not limited to: for the pressure, $10^{-4}$ Torr to $2*10^{-1}$ Torr or $10^{-2}$ Torr to $2*10^{-1}$ Torr; for the source temperature, 600-750° C.; and for the substrate temperature, 300-500° C. The thickness of the II-VI thin film in example embodiments may be in the range of 5 nm to 2 μm (or any range subsumed therein), depending on the desired defect density, crystal quality, and film roughness. The root mean square roughness factor in example embodiments may be 20% of the film thickness. In some example embodiments, the root mean square roughness factor may be in the range of 5% to 20% (or any range subsumed therein). In some example embodiments, the root mean square roughness factor may be at least 5%, 10%, 15% or 20%. The multi-crystalline II-VI thin film 202a may have lateral grain sizes in example embodiments ranging from 1 μm to 500 μm (or any range subsumed therein). Other example ranges for the lateral grain size include 1 μm to 100 μm and 5-30 μm. These films may be doped p-type by introducing dopants (e.g., nitrogen) during film deposition. II-VI materials may also be doped using ion implantation post II-VI layer 202a deposition. In example embodiments, the multi-crystalline II-VI layer may have a defect density in the range of $10^5$ cm$^{-2}$ to $10^{10}$ cm$^{-2}$ (or any range subsumed therein). For example, the defect density may be in the range of $10^6$ cm$^{-2}$ to $10^9$ cm$^{-2}$ or may be in the range of $10^6$ cm$^{-2}$ to $10^8$ cm$^{-2}$.

Electron tunneling typically occurs via band to band transport in high quality, single crystal thin film tunnel junctions. In high concentration PV systems, degenerate doping (e.g., >$10^{18}$ cm$^{-3}$) of both tunnel junction layers is often required to ensure that large photocurrents can travel between photovoltaic-sub cells. However, for low concentration PV systems, the doping levels can be slightly lower and still retain excellent fill factor at these light intensities. Furthermore, the high defect density of the multi-crystalline II-VI layer 202a can provide a secondary pathway for defect mediated tunneling, which can be beneficial compared to less defective single crystal layers.

In some cases (e.g., diffusional doping) a metallic glass may be formed over the top surface of the highly doped n-type Si layer 201 prior to the deposition of the II-VI layer 202a. In this case, the surface can be cleaned using wet chemicals (e.g., hydrofluoric acid) or a dry etch to remove contaminants and expose a bare Si surface. If the n-type Si layer 201 has been exposed to air a thin oxide may form and the top surface can be annealed in a hydrogen environment to remove the oxide and reconstruct the Si surface. Subsequently, the p-type multi-crystalline II-VI layer 301a is deposited on layer 202a using methods described herein with respect to FIG. 1.

It should be noted that interfacial modifications between the Si layer 201a and II-VI layers 202a involving semiconducting monolayer (e.g., arsenic (As)), metallic or semiconductor islands, defected Si surface, or oxide patterns could be used to improve the electrical characteristics of the tunnel junction and improve the overall power conversion efficiency of the multijunction solar cell.

Figure 3:
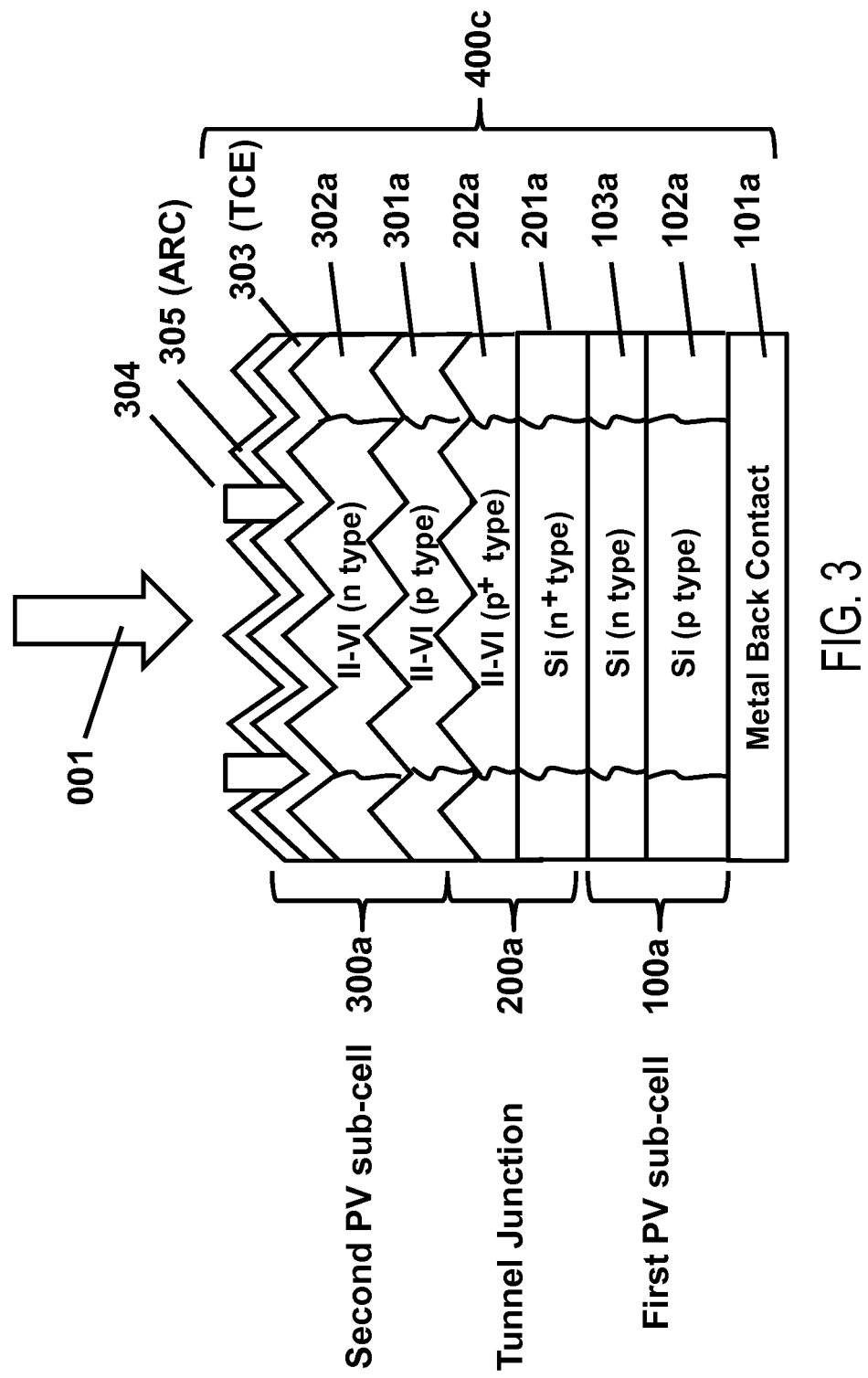
FIG. 3 illustrates a cross-sectional view of a monolithically integrated, multijunction solar cell showing the first photovoltaic sub-cell including multi-crystalline silicon semiconductor layers with a p-type base and n-type emitter, the tunnel heterojunction comprised of multi-crystalline $n^+$-type silicon layer and multi-crystalline $p^+$-type group II-VI semiconductor layer, and the second photovoltaic sub-cell including multi-crystalline group II-VI semiconductor layers with a p-type base and n-type emitter according to an alternative embodiment.

Reference is now made to FIG. 3, which illustrates a cell 400c in accordance with another embodiment of the multijunction solar cell. Cell 400c of FIG. 3 is a variant of the cell 400b of FIG. 2 and/or cell 400a of FIG. 1. In this embodiment, the p-type Si layer 201a is comprised of either a multi-crystalline Si wafer or multi-crystalline Si thin film grown on metal foil or glass. Unlike the previously described multi-crystalline II-VI layers, the multi-crystalline Si films are smoother than II-VI grown thin films, as shown in FIG. 3. The doping of the first PV sub-cell 100a is similar to methods for single crystal Si, which was previously described. The resulting grain size, roughness factor, and defect density of the multi-crystalline II-VI layers 202a, 301a, 302a was previously described with respect to FIGS. 1 and 2. It should be noted that the multi-crystalline II-VI layers 202a, 301a, 302a may not retain the high in-plane and out-of-plane orientations because of the relatively large spread in crystal orientations in multi-crystalline Si thin films. The crystal orientation of p-type multi-crystalline Si layer 102a will affect the morphology of all subsequent layers 103a and 201a. Deposition methods to form the tunnel heterojunction 200a were previously described in connection with FIG. 2, and II-VI photovoltaic sub-cell 300a formation was previously described in connection with FIG. 1.

Figure 4:
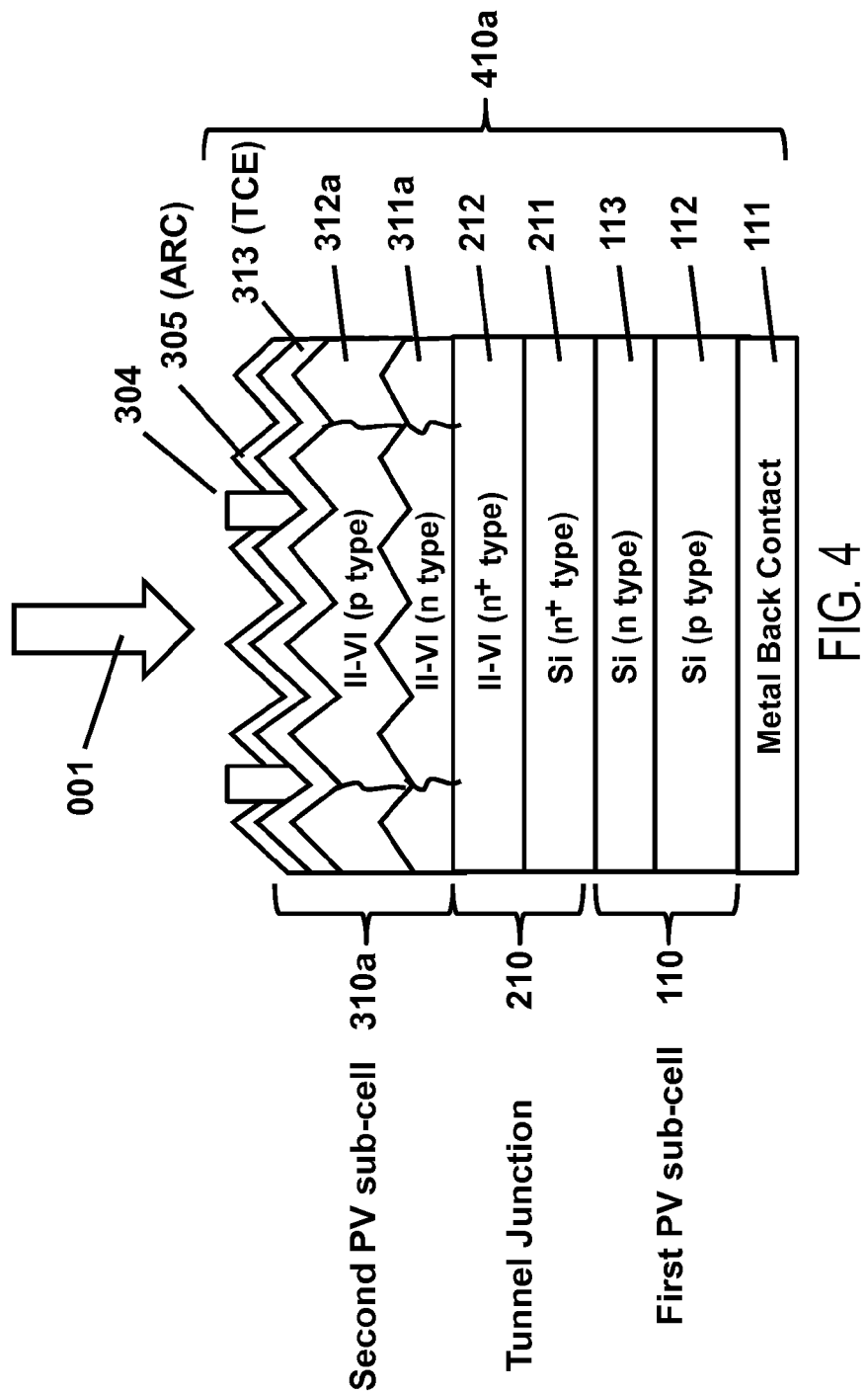
FIG. 4 illustrates a cross-sectional view of a monolithically integrated, multijunction solar cell showing the first photovoltaic sub-cell including single crystal silicon semiconductor layers with a n-type base and p-type emitter, the tunnel heterojunction including a single crystal $p^+$-silicon semiconductor layer and single crystal $n^+$-type group II-VI semiconductor layer, and the second photovoltaic sub-cell including multi-crystalline group II-VI semiconductor layers with a n-type base and p-type emitter according to an alternative embodiment.

Reference is now made to FIG. 4, which illustrates a cell 410a in accordance with another embodiment of the multijunction solar cell. Cell 410a of FIG. 4 is a variant of the cell 400a of FIG. 1. The polarity of multijunction solar cell 400a in FIG. 1 can be reversed as shown in FIG. 4. In FIG. 4, the multijunction solar cell 410a is comprised of a single crystal n-type Si base 112, p-type emitter 113 in the first photovoltaic sub-cell 110, a single crystal p$^+$-n$^+$ tunnel heterojunction 210, and a multi-crystalline n-type base 311a and p-type emitter layer 312a in the second photovoltaic sub-cell 310a. A p-type transparent conducting electrode 313 provides ohmic contact to the p-type II-VI emitter 312a. Each of layers 112, 113, 211, 212, 311a, 312a, and 313 of cell 410a comprises an opposite dopant polarity to respective layers 102, 103, 201, 202, 301a, 302a, and 303 of cell 400a. For example, a second PV sub-cell 310a of cell 410a comprises a II-VI p-type base layer 312a and a II-VI n-type emitter layer 311a while the second PV sub-cell 300a of cell 400a comprises a II-VI n-type base layer 302a and a II-VI p-type emitter layer 301a. Aside from the use of opposite dopant polarities, layers 112, 113, 211, 212, 311a, and 312a are similar to those respectively discussed above at least with respect to FIG. 1.

In additional embodiments, such polarity change can also be implemented with respect to cells 400b or 400c to form alternative solar cell structures. For example, a solar cell fabricated with opposite dopant polarities to that of cell 400b comprises the first photovoltaic sub-cell including single crystal silicon semiconductor layers with a n-type base and p-type emitter, the tunnel heterojunction comprised of a single crystal $p^+$-silicon layer and a multi-crystalline $n^+$-type group II-VI semiconductor layer, and the second photovoltaic sub-cell including multi-crystalline group II-VI semiconductor layers with a n-type base and p-type emitter. As another example, a solar cell fabricated with opposite dopant polarities to that of cell 400c comprises the first photovoltaic sub-cell including multi-crystalline silicon semiconductor layers with a n-type base and p-type emitter, the tunnel heterojunction comprised of multi-crystalline $p^+$-type silicon layer and multi-crystalline $n^+$-type group II-VI semiconductor layer, and the second photovoltaic sub-cell including multi-crystalline group II-VI semiconductor layers with a n-type base and p-type emitter.

In example embodiments, any of the multijunction solar cells 400a-400c or 410a can further include deposition of a thin n-type transparent conducting electrode (TCE) layer 303 over layer 302a (or p-type TCE layer 313 over layer 312a for cell 410a). Layer 303 (or layer 313 for cell 410a) may be comprised of a metal oxide such as indium tin oxide via sputter deposition, metallic nanowires (e.g., Ag or platinum (Pt) nanowires) with a high aspect ratio, which can be either solution processed or spray deposited, or some film composite including transparent conducting oxides and metallic nanowires. The metallic fingers 304 can be deposited over at least a portion of layer 303 (or layer 313 for cell 410a) via evaporative deposition or screen printing. In example embodiments, any of the multijunction solar cells 400a-400c or 410a can also include the deposition of an anti-reflective coating 305 over layer 303 or layer 313 (leaving the metallic fingers 304 exposed), in which the coating 305 may be comprised of a 100 nm thick $MgF_2$ layer. Those skilled in the art will appreciate that coating 305 may comprise other suitable anti-reflective coating compositions and/or thicknesses.

Figure 5:
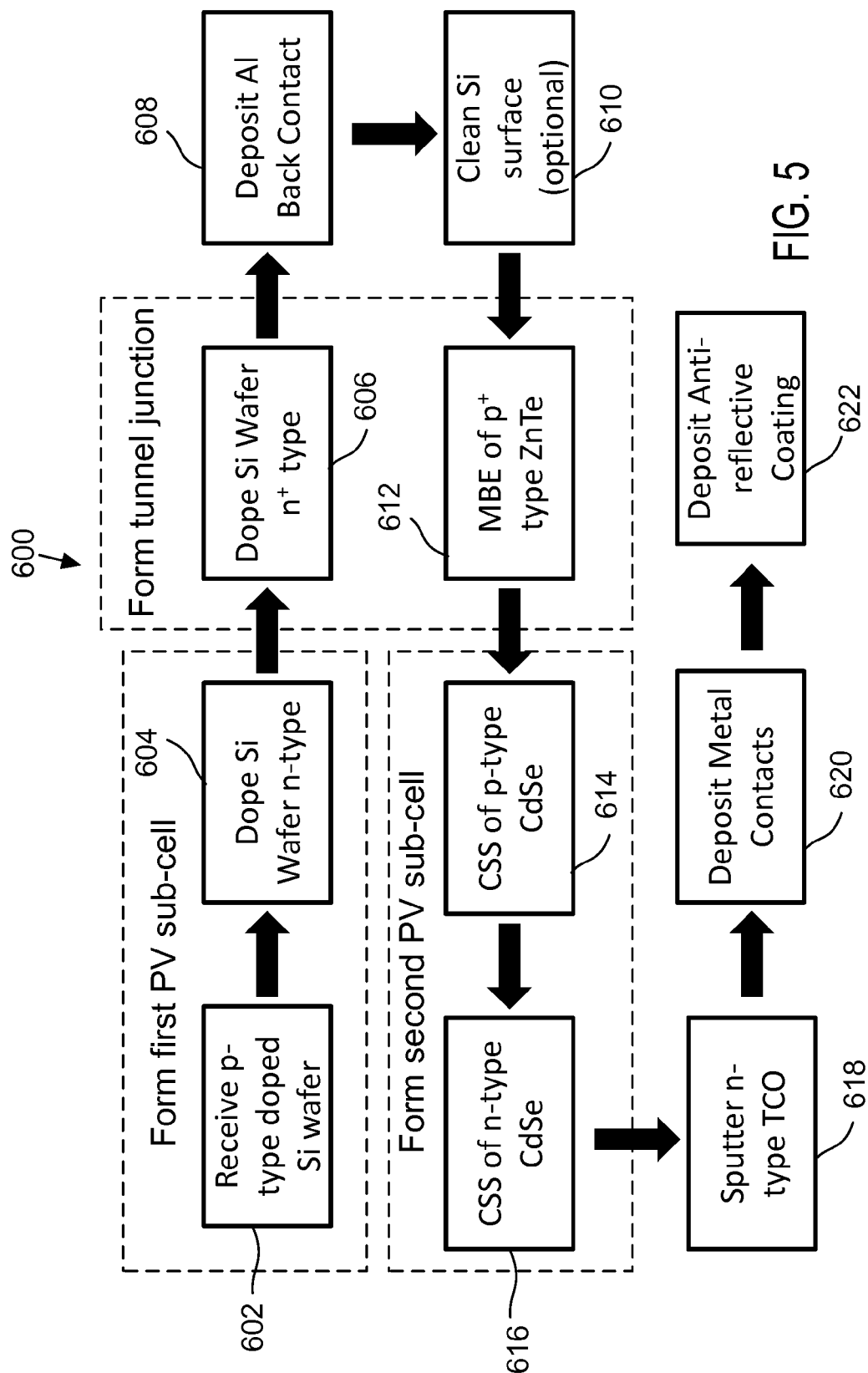
FIG. 5 illustrates an example flow diagram to fabricate the multi-crystalline II-VI/Si multijunction solar cell referenced in FIG. 1.

FIGS. 5-8 show example flow diagrams illustrating additional methodologies for fabrication of cells 400a, 400b, 400c, and 410a according to some embodiments. FIG. 5 illustrates an example flow diagram 600 for fabrication of cell 400a shown in FIG. 1 according to some embodiments. At a block 602, a p-type doped silicon wafer or substrate is received which forms the p-type silicon layer 102. Then at a block 604, at least the top portion of the wafer is doped with an n-type dopant to form the n-type silicon layer 103. The wafer is then doped, at a block 606, with an $n^+$-type dopant to form the $n^+$-type silicon layer 201 (above the layer 103). Next at a block 608, the metallic (aluminum) back contact 101 is deposited adjacent to the layer 102.

The silicon surface (e.g., top of layer 201) can then be optionally cleaned at a block 610. The tunnel junction 200 can then be completed by depositing a layer of $p^+$ type ZnTe using molecular beam epitaxy (MBE) to form layer 202 (block 612). Alternatively, the multi-crystalline, p+ type ZnTe layer may be formed by sputter deposition. The p-type CdSe and n-type CdSe can be deposited next using closed-space sublimation (CSS) using the process parameters described above to form the multi-crystalline II-VI layers 301a and 302a (blocks 614 and 616 respectively). Then n-type TCO may be sputtered to form layer 303 over layer 302a (block 618). Next, metal contacts 304 may be deposited over at least a portion of layer 303 (block 620), and then the anti-reflective coating (ARC) 305 may be deposited over layer 303, excluding metal contacts 304, at a block 622.

It is understood that flow diagram 600 illustrates an example process only and other and/or additional processing and process steps may be used in other embodiments. As an example, deposition of materials to form a given layer of cell 400a (e.g., layer 202, 301a, 302a, 303, 305) can comprise one or more sub-steps and/or deposition of one or more sub-layers or thin film to form a composite layer or thin film stack.

Figure 6:
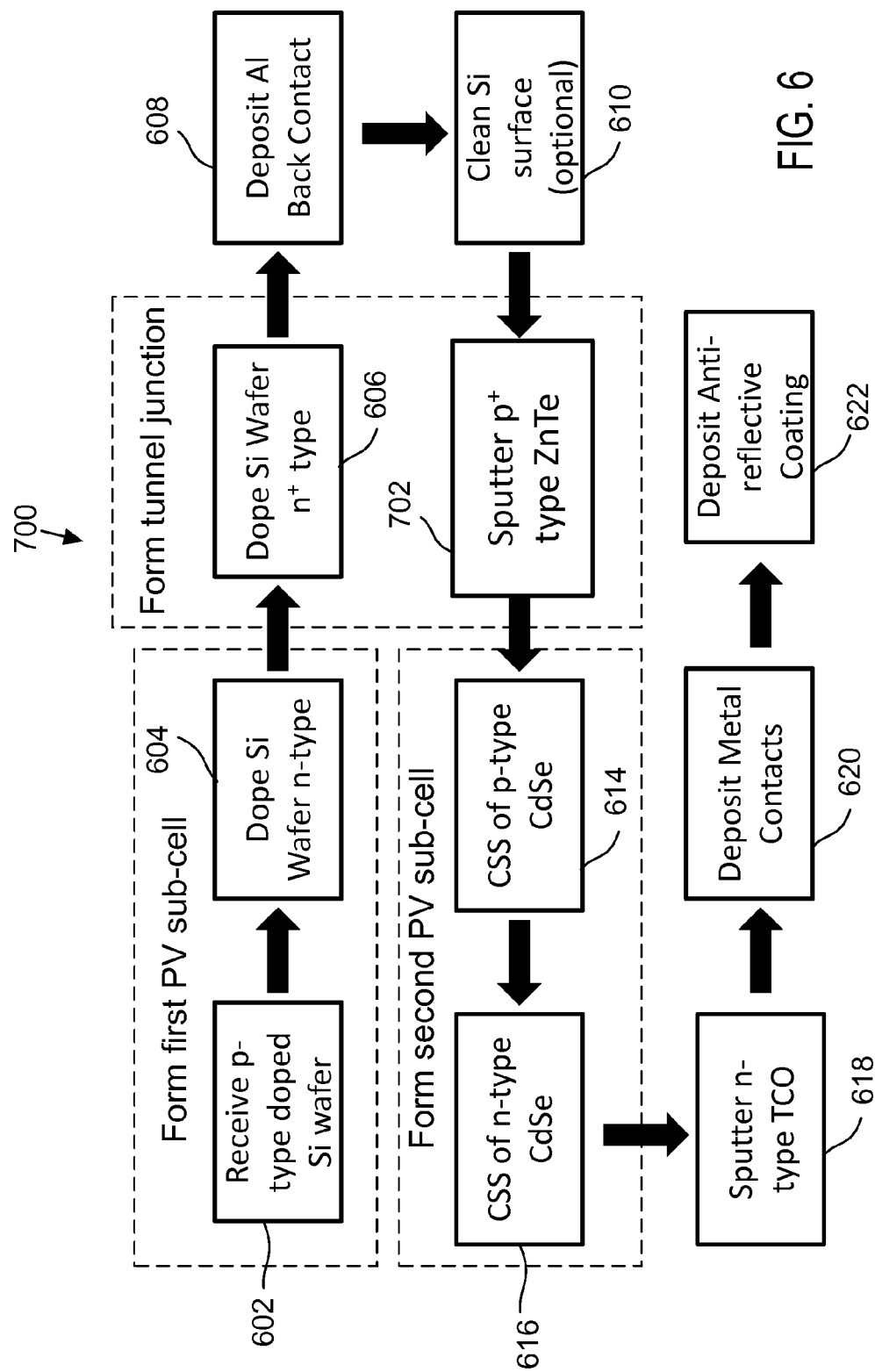
FIG. 6 illustrates an example flow diagram to fabricate the multi-crystalline II-VI/Si multijunction solar cell referenced in FIG. 2.

FIG. 6 illustrates an example flow diagram 700 for fabrication of cell 400b shown in FIG. 2 according to some embodiments. Flow diagram 700 is similar to flow diagram 600 of FIG. 5 except for the operation of block 702 in place of block 612. In block 702, the II-VI $p^+$-type layer 202a is formed by sputtering $p^+$-type ZnTe directly onto the $n^+$-type Si surface of layer 201, resulting in a multi-crystalline layer 202a as shown in FIG. 2.

Figure 7:
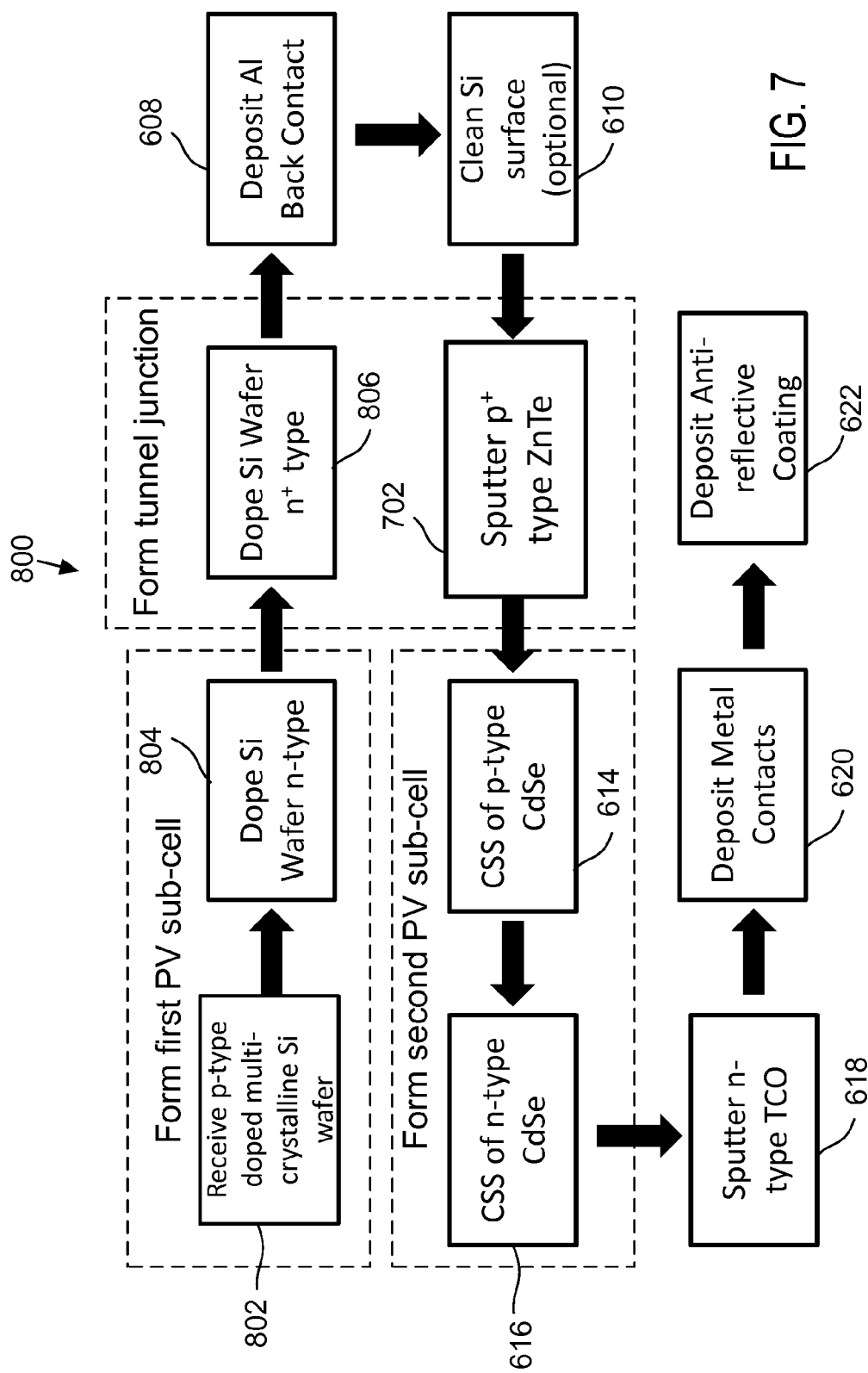
FIG. 7 illustrates an example flow diagram to fabricate the multi-crystalline II-VI/Si multijunction solar cell referenced in FIG. 3.

FIG. 7 illustrates an example flow diagram 800 for fabrication of cell 400c shown in FIG. 3 according to some embodiments. Flow diagram 800 is similar to flow diagram 700 of FIG. 6 except for blocks 802, 804, 806 in place of blocks 602, 604, 606, respectively. At a block 802, a p-type doped multi-crystalline Si wafer or substrate is received (rather than a single crystalline Si wafer or substrate). The bottom portion of this Si wafer forms layer 102a. Next at a block 804, at least a top portion of the p-type doped multi-crystalline Si wafer is doped with a n-type dopant to form layer 103a. At least a top portion of the Si wafer is additionally doped with a $n^+$-type dopant, thereby forming layer 201a (block 806). Accordingly, a multi-crystalline Si substrate is used to make the fully multi-crystalline solar cell 400c shown in FIG. 3.

Figure 8:
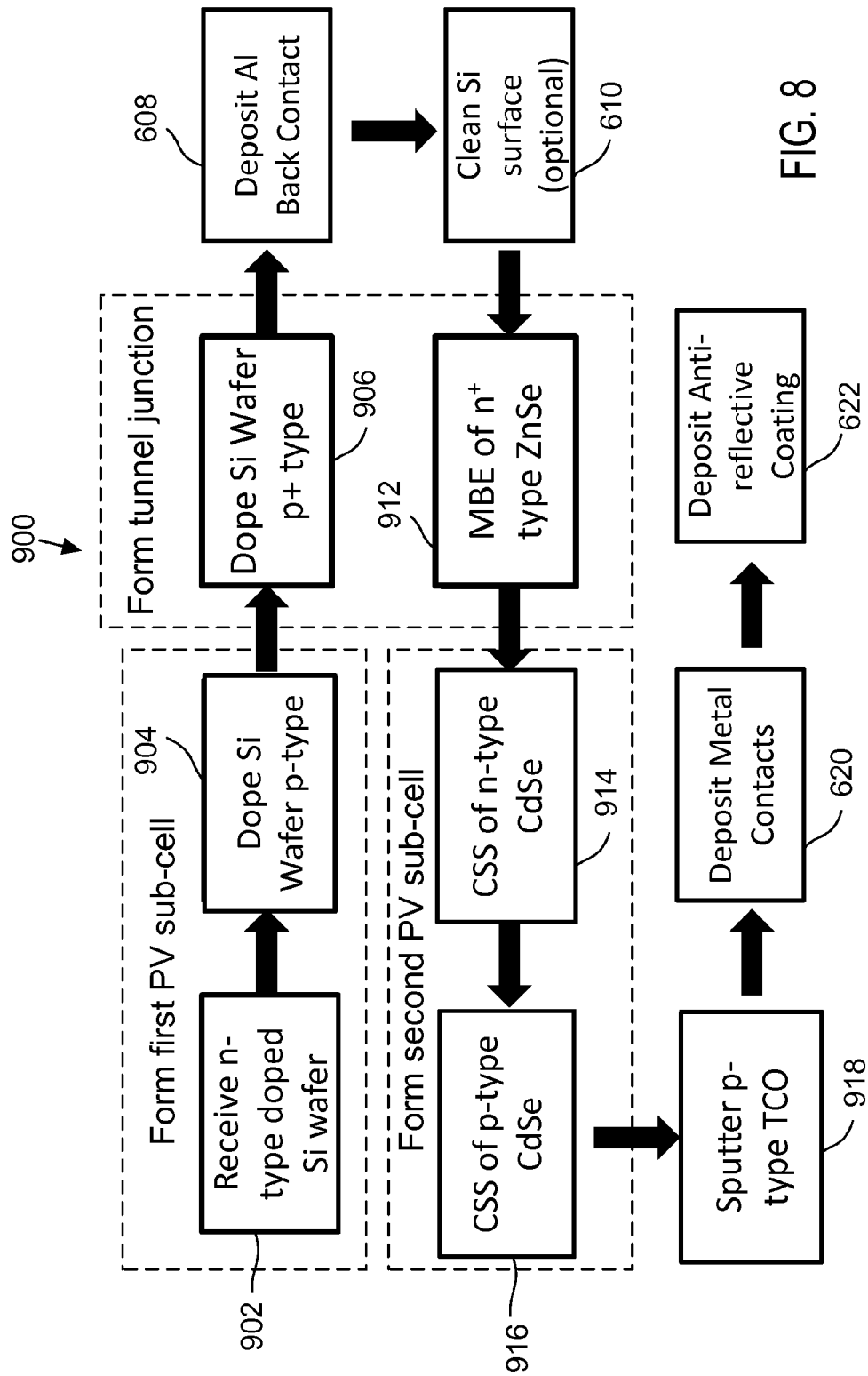
FIG. 8 illustrates an example flow diagram to fabricate the multi-crystalline II-VI/Si multijunction solar cell referenced in FIG. 4.

FIG. 8 illustrates an example flow diagram 900 for fabrication of cell 410a shown in FIG. 4 according to some embodiments. Flow diagram 900 is similar to flow diagram 600 except blocks 902, 904, 906, 912, 914, 916, and 918 are performed using the opposite dopant polarity to those discussed above with respect to blocks 602, 604, 606, 612, 614, 616, and 618, respectively. While FIGS. 1-4 show multijunction solar cells comprised of a single silicon photovoltaic based sub-cell, a single tunnel junction, and a single II-VI group based photovoltaic sub-cell, it is contemplated that a given multijunction solar cell may comprise one or more of each of a photovoltaic based sub-cell, tunnel junction, and multi-crystalline II-VI photovoltaic sub-cell by repeating one or more of select blocks of flow diagrams 600, 700, 800, or 900.

In some embodiments, the resulting II-VI/Si based photovoltaic cells (e.g., cells 400a, 400b, 400c, and/or 410a) have a short-circuit current density between 12-20 $mA/cm^2$, an open-circuit voltage between 1.4-2 V, and a Fill Factor between 0.65-0.85. And the resulting power conversion efficiency of individual tandem PV cells can be between 19-27% or a maximum of about 30%. Typically the overall power conversion efficiency of multi-crystalline PV cells is lower than for single crystal devices due to increased recombination caused by the morphology.

Flat Panel (One Sun) Module

Figure 9:
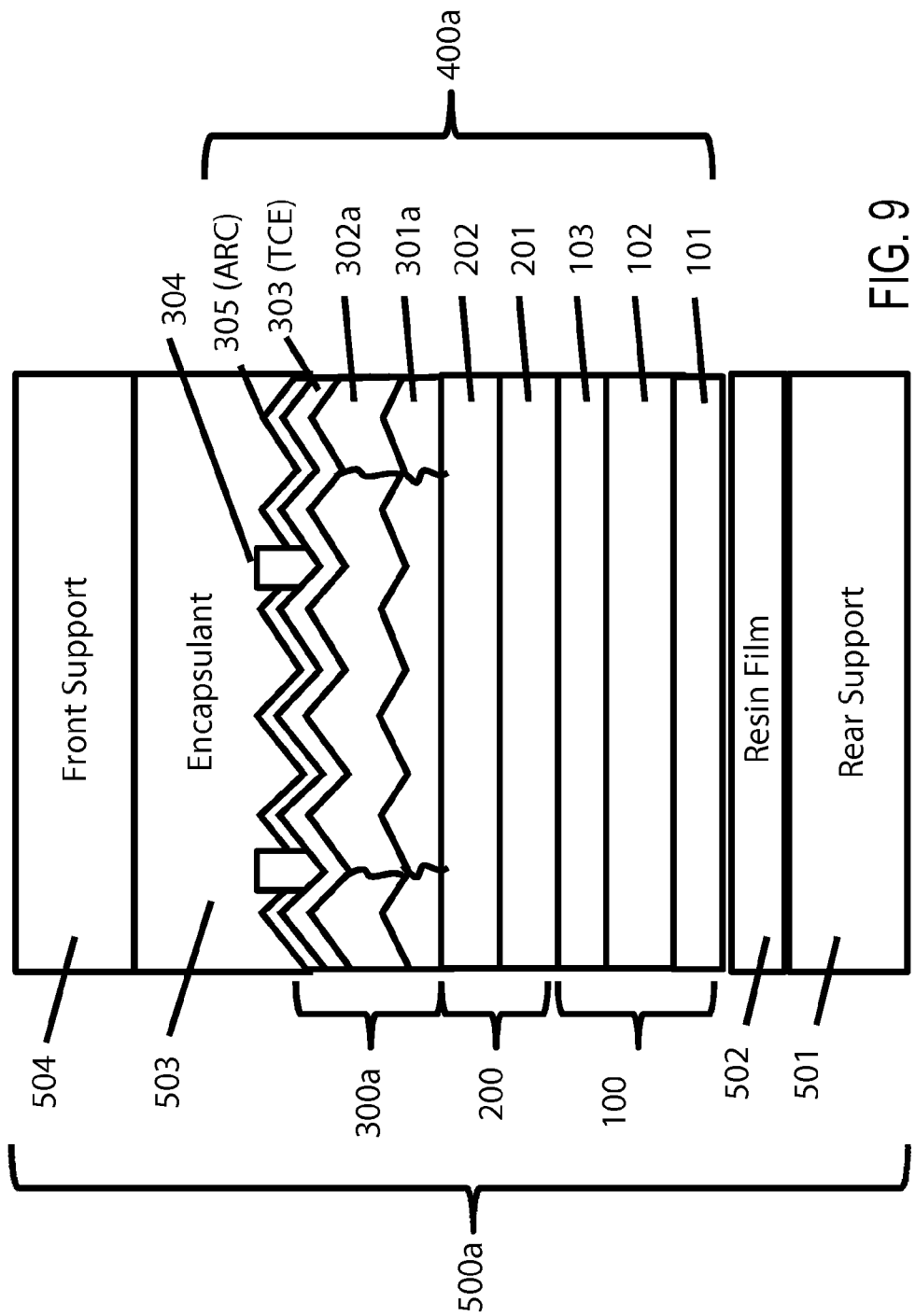
FIG. 9 illustrates a cross-sectional view of an example flat panel (one sun) module including a plurality of the multi-crystalline II-VI/Si multijunction solar cells according to some embodiments.

With reference to FIG. 9 a cross-sectional view of an example flat panel solar module 500a is shown. The flat panel solar module 500a in an example embodiment may be comprised of a front support layer 504, an encapsulant layer 503, interconnected solar cells (one or more solar cells, such as solar cell 400a), and a back side construction, which can be made from a resin film 502 and optionally a rear glass support 501. The front support layer 504 is highly impermeable to water and have a relatively high light transparency for wavelengths of 350-1200 nm. The front support layer 504 may be made from tempered low-iron glass that is 3-4 mm thick. Solar cells, such as solar cells 400a-c, may be soldered together in either a series or parallel configuration prior to lamination with the encapsulant layer 503. An example encapsulant is ethylene vinyl-acetate (EVA), which is melted at 150° C. and flows between the glass support 504 and the solar cells (such as cells 400*a*) and then is subsequently thermally cross-linked. The back side construction may include a second sheet of glass 501 with a resin film 502 used to mount the solar cells. Aluminum frames (not shown) may surround the module to provide additional structural support and a junction box is used to string panels (not shown). It should be noted that there are many module variations in terms of materials choices, construction methods, panel size, and solar cell string and junction box configurations for flat panel modules that multi-crystalline II-VI/Si tandem solar cells could be implemented in depending on climate, lighting conditions, applications (e.g., residential versus utility), and governmental regulations. In any case, one or more solar cells (e.g., solar cells 400*a*, 400*b*, and/or 400*c*) can be electrically connected to each other in series or parallel and further encapsulated or packaged into a (flat panel) module such as shown in module 500*a*. Similarly, one or more of solar cell 410*a* and/or solar cell 400*b* or 400*c* configured with opposite dopant polarity (see discussion above) can be electrically connected to each other in series or parallel, and encapsulated or packaged together into a (flat panel) module such as shown in module 500*a*.

Figure 10:
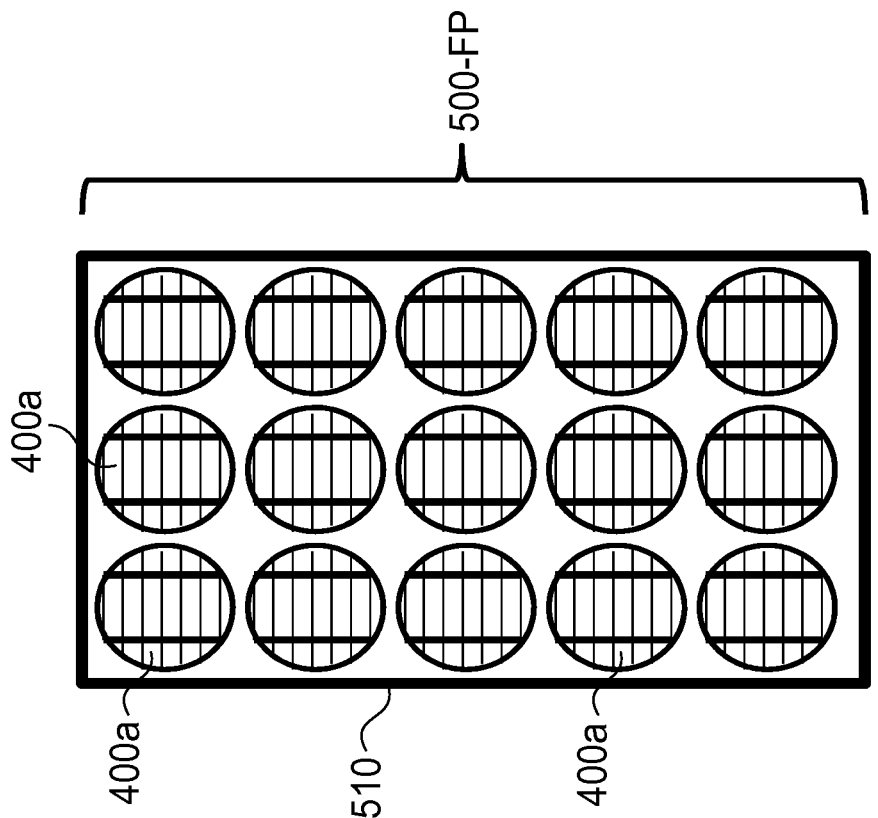
FIG. 10 illustrates a top view of an example flat panel (one sun) module of FIG. 9 according to some embodiments.

FIG. 10 illustrates a top view of an example flat panel module 500-FP including a plurality of multi-crystalline II-VI/Si based solar cells electrically coupled together to form a solar cell circuit and packaged together within a frame 510. (The flat panel module shown in FIGS. 9 and 10 may be the same module shown in different views.) In the example flat panel module 500-FP, the solar cells (such as solar cells 400*a*) are tightly packed in a glass encased module surrounded by an aluminum frame 510. Circularly shaped wafers may be packed tightly in the module to cover >75% of the aperture area of the module, while square cut wafers can cover >90% of the module's aperture area. In some embodiments, the solar cells (and the multi-crystalline II-VI thin films deposited across the solar cells) may cover at least 50% of the aperture area of the module. In some examples, the total surface area of the solar cells (and the multi-crystalline II-VI group material of the solar cells) may be at least 75% or 90% or more of the aperture area.

The size of the module is determined by the number of solar cells. Solar cell modules in some examples may contain as few as one solar cell and as many as 200 cells. An example solar cell module may contain approximately 72 solar cells and are three feet by five feet in dimension. In some examples, the modules may have an aperture area in the range of 2 to 50 square feet or any range subsumed therein, and the area covered by the solar cells (and the multi-crystalline II-VI thin films deposited across the solar cells) in the module may be in the range of 1 to 25 square feet or any range subsumed therein. The solar cells 400*a* are wired in series and parallel configuration with one another in order to obtain the desired voltage and current, and are connected to the panel through a junction box (not shown). Bypass diodes are generally added to the solar cell circuit to reduce hot spot damage during shading.

Figure 12:
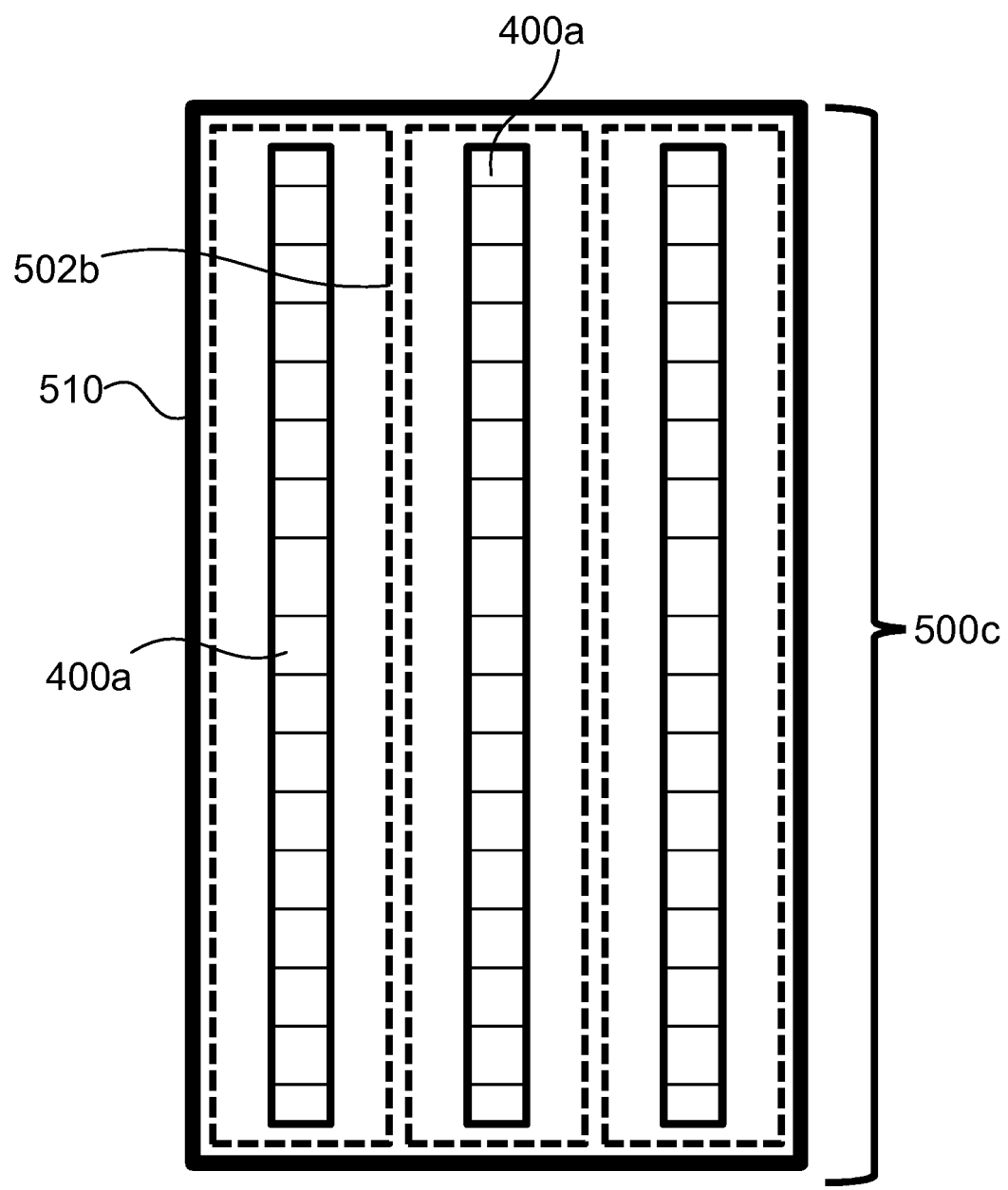
FIG. 12 illustrates a top view of an example low concentration photovoltaic cell module (e.g., 3× sun) including a plurality of the multi-crystalline II-VI/Si multijunction solar cells configured in a linear pattern according to some embodiments.
Figure 13:
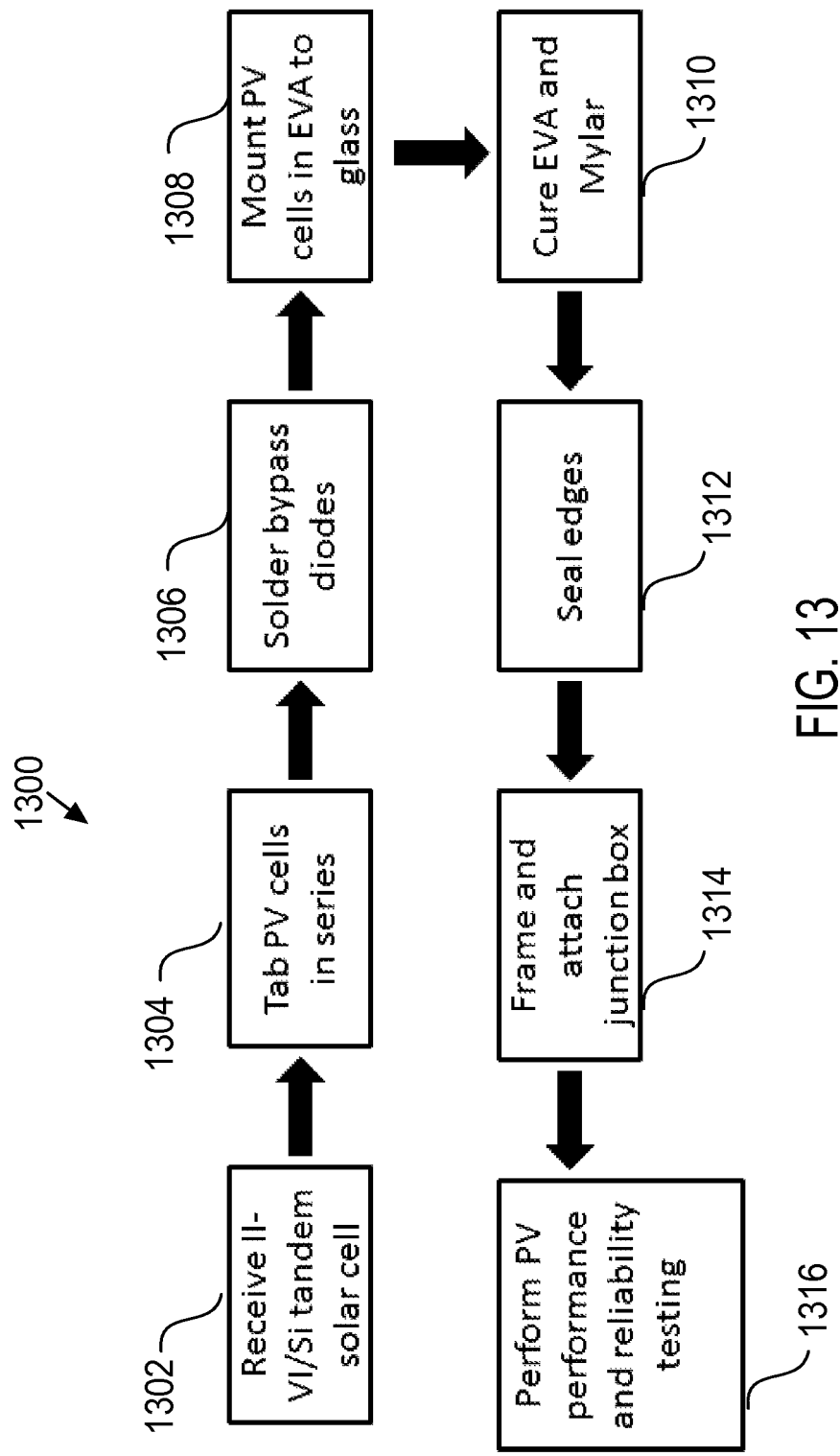
FIG. 13 illustrates an example flow diagram to fabricate the multi-crystalline II-VI/Si multijunction solar cell module referenced in any of FIGS. 9-12 according to some embodiments.

FIG. 13 illustrates an example flow diagram 1300 to fabricate the flat panel module 500-FP referenced in FIG. 9 according to some embodiments. Modules 500*b* and 500*c* shown in FIGS. 11 and 12, respectively, can similarly be fabricated in accordance with the flow diagram 1300 in some embodiments. At a block 1302, a plurality of II-VI/Si solar cells (e.g., cells 400*a*, 400*b*, 400*c*, and/or 410*a*) are received, tested, and grouped by efficiency to assemble into a flat panel module. Next at a block 1304, the plurality of solar cells are electrically coupled to each other in a series or parallel configuration depending on desired performance characteristics. To the electrically coupled plurality of solar cells (also referred to as a solar cell circuit, solar cell circuitry, tandem solar cells, interconnected solar cells, and the like) one or more bypass diodes can be added to reduce hot spot damage when at least a portion of the solar cells are in a shaded area (block 1306).

Next at a block 1308, the solar cell circuitry (and any other associated circuitry, such as the bypass diodes) is mounted, encapsulated, or packaged in one or more layers of encapsulant and/or supporting materials. For example, the top of the solar cell circuitry (the side on which the light would impinge) can be protected by depositing ethylene vinyl-acetate (EVA) to form encapsulant layer 503 and glass to form front support layer 504. Similarly, materials (as discussed above) can be deposited on the underside of the solar cell circuitry to form the resin film 502 and optionally, a rear glass support 501. Depending on the materials deposited, such materials may be further processed, such as cured, at a block 1310.

Once the deposition of one or more layers to the solar cell circuitry is complete, final packaging commences. Edges of the modules may be sealed (block 1312), the frame 510 attached (to provide additional structural support), light concentrating apparatus installed (in the case of low or medium concentration modules such as modules 500*b* or 500*c*), and a junction box may also be electrically coupled to the solar cell circuitry (block 1314). Lastly, one or more performance and reliability testing may be performed on the resulting module at a block 1316 before shipping or installation.

Multi-crystalline II-VI/Si tandem solar cells can be used to replace single junction Si and GaAs solar cells in many currently manufactured flat panel modules. While the embodiment describes the use of whole (six inch) wafers it is also possible to use stripes of multijunction solar cells in the one-sun configuration.

Low (2-10×) and Medium (10-50×) Concentration Modules

Figure 11:
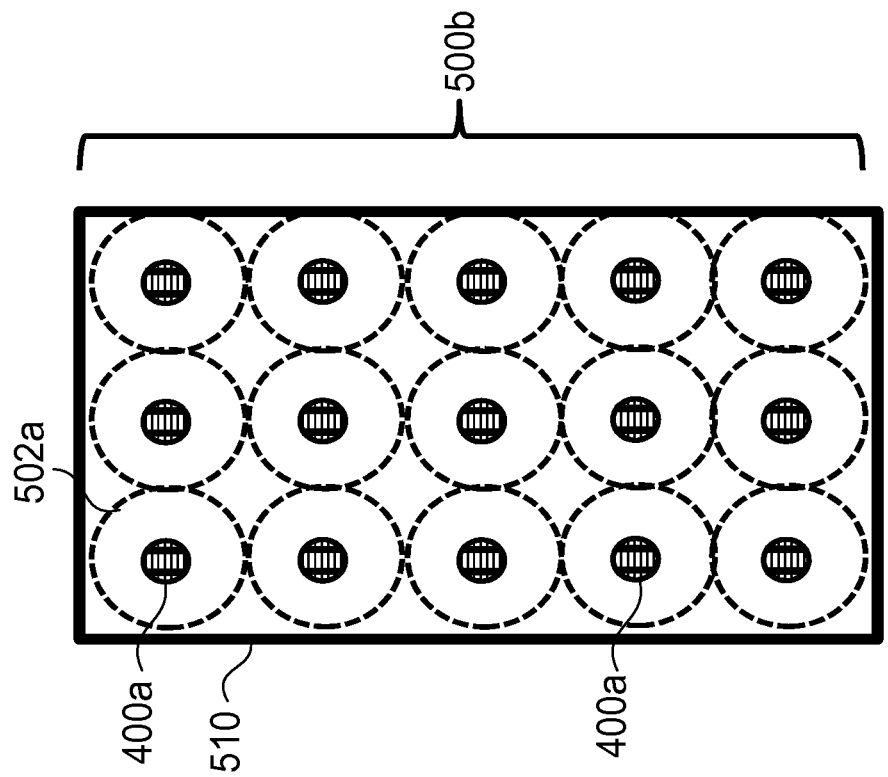
FIG. 11 illustrates a top view of an example low concentration photovoltaic cell module (e.g., 3× sun) including a plurality of the multi-crystalline II-VI/Si multijunction solar cells configured in a circular pattern according to some embodiments.

Light concentration in solar cell modules involves focusing the light from a large area onto a smaller area, the difference between the aperture area of the module and the solar cell area surface area known as the concentration factor. Low light concentration (2-10× sun) and medium light concentration (10-50×) configurations reduce the required photovoltaic cell surface area due to the power conversion efficiency of the solar cells increasing with increased light concentration. As shown in FIG. 11, an example low light concentration (e.g., 3× sun) module 500*b* is comprised of a light concentrating apparatus 502*a* and a plurality of interconnected solar cells (e.g., solar cells 400*a*). In this system, the solar cell area (and the multi-crystalline II-VI thin films deposited across the solar cells) may be less than 34% of the module aperture area. The light concentrating apparatus 502*a* may use refractive (e.g., Fresnel lens) or reflective (e.g., mirrored parabolic dish) to concentrate the sunlight onto the solar cells 400*a*. Depending on the light concentration factor a heat sink may be used to cool the device and improve performance. The shape of the solar cell 400*a* determines the design of the light concentrating apparatus 502*a*.

As shown in FIG. 12, the solar cells 400*a* included in a module 500*c* may also be in a striped configuration. In this case, the module 500*c* may use a trough collector or a modified Fresnel lens configuration as the light concentrating apparatus 502*b*. The light concentration factor will determine the light concentrating apparatus design and the required solar cell area. At low light concentrations no-axis or single axis concentration is usually used. At medium concentration two axis light concentration may be used for circularly shaped solar cell designs.

Multi-crystalline II-VI/Si based tandem solar cells can be used to replace single junction GaAs and Si based solar cells in low and medium light concentration modules in order to further reduce system costs. Module designs of 2-50× sun concentration for single junction PV devices, which may use refractive or reflective concentrations above the multi junction solar cells, can be used with the multi-crystalline II-VI/Si based tandem solar cells discussed herein. Examples of such module designs are discussed in U.S. Published Application No. 2010/0282316 by Gibson et al.; U.S. Published Application No. 2009/0188563 by Gibson et al.; U.S. Published Application No. 2007/0193620 by Hines et al.; U.S. Pat. No. 7,297,865 by Terao et al.; U.S. Published Application No. 2010/0206352 by Gee et al.; U.S. Pat. No. 5,409,550 by Safir et al.; U.S. Pat. No. 7,569,764 by Shan et al.; U.S. Pat. No. 5,520,747 by Marks et al.; U.S. Pat. No. 7,872,192 by Fraas et al.; U.S. Pat. No. 7,672,549 by Ghosh et al.; and U.S. Published Application No. 2010/0288332 by O'Neill, all of which are incorporated herein by reference in their entirety. These modules may include various embodiments described herein by replacing conventional solar cells with the multi-crystalline II-VI/Si based tandem solar cells as described above. Multi-crystalline II-VI/Si based tandem solar cells with increased power efficiency can provide lower installed cost-per-watt ($/W) in a wide range of low concentration module types over Si based single junction PV devices.

Example 1 can include or use a monolithic, multijunction solar cell, the multijunction solar cell comprising a first photovoltaic sub-cell, a tunnel junction provided over the first photovoltaic sub-cell, and a second photovoltaic sub-cell provided over the tunnel junction. The tunnel junction includes a II-VI semiconductor material layer having a band gap greater than 1.5 eV. The second photovoltaic sub-cell includes a multi-crystalline group II-VI semiconductor material base and a multi-crystalline group II-VI semiconductor material emitter having band gaps greater than 1.5 eV, wherein light incident on the monolithic, multijunction solar cell is received by the second photovoltaic sub-cell before the first photovoltaic sub-cell.

Example 2 can include, or can optionally be combined with the multijunction solar cell of Example 1 to include, any of the II-VI semiconductor material layer, the multi-crystalline group II-VI semiconductor material base, or the multi-crystalline group II-VI semiconductor material emitter consisting of one or more of ZnTe, ZnSe, CdSe, CdTe, MgSe, and MgTe or alloys of one or more of ZnTe, ZnSe, CdSe, CdTe, MgSe, and MgTe.

Example 3 can include, or can optionally be combined with the multijunction solar cell of one or any combination of Examples 1 or 2 to include, the group II-VI semiconductor material layer included in the tunnel junction being multi-crystalline.

Example 4 can include, or can optionally be combined with the multijunction solar cell of one or any combination of Examples 1 through to include, the first photovoltaic sub-cell including a p-type base and an n-type emitter.

Example 5 can include, or can optionally be combined with the multijunction solar cell of one or any combination of Examples 1 through 4 to include, the first photovoltaic sub-cell including an n-type base and a p-type emitter.

Example 6 can include, or can optionally be combined with the multijunction solar cell of one or any combination of Examples 1 through 5 to include, the multi-crystalline group II-VI semiconductor material base of the second photovoltaic sub-cell in contact with the tunnel junction comprising an n-type doped layer having an n-type dopant concentration between $10^{15}$ to $10^{19}$ cm$^{-3}$ and the multi-crystalline group II-VI semiconductor material emitter of the second photovoltaic sub-cell comprising a p-type doped layer having a p-type dopant concentration between $10^{15}$ to $10^{18}$ cm$^{-3}$.

Example 7 can include, or can optionally be combined with the multijunction solar cell of one or any combination of Examples 1 through 6 to include, the multi-crystalline group II-VI semiconductor material base of the second photovoltaic sub-cell in contact with the tunnel junction comprising a p-type doped layer having a p-type dopant concentration between $10^{15}$ to $10^{18}$ cm$^3$ and the multi-crystalline group II-VI semiconductor material emitter of the second photovoltaic sub-cell comprising an n-type doped layer having an n-type dopant concentration between $10^{15}$ to $10^{19}$ cm$^{-3}$.

Example 8 can include, or can optionally be combined with the multijunction solar cell of one or any combination of Examples 1 through 7 to include, at least one of the multi-crystalline group II-VI semiconductor material base and the multi-crystalline group II-VI semiconductor material emitter having a thickness in a range of 50 nm to 8 µm.

Example 9 can include, or can optionally be combined with the multijunction solar cell of one or any combination of Examples 1 through 8 to include, a root mean square roughness factor of at least one of the second photovoltaic sub-cell and the II-VI semiconductor material layer being in a range of 1% to 20%.

Example 10 can include, or can optionally be combined with the multijunction solar cell of one or any combination of Examples 1 through 9 to include, a root mean square roughness factor of the second photovoltaic sub-cell being at least 1%.

Example 11 can include, or can optionally be combined with the multijunction solar cell of one or any combination of Examples 1 through 10 to include, the II-VI semiconductor material layer included in the tunnel junction comprising a different group II-VI semiconductor material than the second photovoltaic sub-cell.

Example 12 can include, or can optionally be combined with the multijunction solar cell of one or any combination of Examples 1 through 10 to include, the II-VI semiconductor material layer included in the tunnel junction comprising a same group II-VI semiconductor material as at least a portion of the second photovoltaic sub-cell.

Example 13 can include, or can optionally be combined with the multijunction solar cell of one or any combination of Examples 1 through 12 to include, at least one of the multi-crystalline group II-VI semiconductor material base, the multi-crystalline group II-VI semiconductor material emitter, and the II-VI semiconductor material having a defect density in a range of $10^5$ cm$^{-2}$ to $10^{10}$ cm$^{-2}$.

Example 14 can include, or can optionally be combined with the multijunction solar cell of one or any combination of Examples 1 through 13 to include, at least one of the multi-crystalline group II-VI semiconductor material base and the multi-crystalline group II-VI semiconductor material emitter included in the second photovoltaic sub-cell having a defect density in a range of $10^6$ cm$^{-2}$ to $10^9$ cm$^{-2}$.

Example 15 can include, or can optionally be combined with the multijunction solar cell of one or any combination of Examples 1 through 14 to include, at least one of the multi-crystalline group II-VI semiconductor material base and the multi-crystalline group II-VI semiconductor material emitter included in the second photovoltaic sub-cell having a defect density in a range of $10^6$ cm$^{-2}$ to $10^8$ cm$^{-2}$.

Example 16 can include, or can optionally be combined with the multijunction solar cell of one or any combination of Examples 1 through 15 to include, at least one of the multi-crystalline group II-VI semiconductor material base and the multi-crystalline group II-VI semiconductor material emitter included in the second photovoltaic sub-cell having a lateral grain size in a range of 1 µm to 500 µm.

Example 17 can include, or can optionally be combined with the multijunction solar cell of one or any combination of Examples 1 through 16 to include, at least one of the multi-crystalline group II-VI semiconductor material base and the multi-crystalline group II-VI semiconductor material emitter included in the second photovoltaic sub-cell having a lateral grain size in a range of 1 µm to 100 µm.

Example 18 can include, or can optionally be combined with the multijunction solar cell of one or any combination of Examples 1 through 17 to include, at least one of the multi-crystalline group II-VI semiconductor material base and the multi-crystalline group II-VI semiconductor material emitter included in the second photovoltaic sub-cell having a lateral grain size in a range of 5 µm to 30 µm.

Example 19 can include, or can optionally be combined with the multijunction solar cell of one or any combination of Examples 1 through 18 to include, the II-VI semiconductor material layer included in the tunnel junction having a lateral grain size in a range of 1 µm to 100 µm.

Example 20 can include, or can optionally be combined with the multijunction solar cell of one or any combination of Examples 1 through 19 to include, the II-VI semiconductor material layer included in the tunnel junction having a lateral grain size in a range 5 µm to 30 µm.

Example 21 can include, or can optionally be combined with the multijunction solar cell of one or any combination of Examples 1 through 20 to include, the first photovoltaic sub-cell comprising a wafer or thin film of silicon.

Example 22 can include, or can optionally be combined with the multijunction solar cell of one or any combination of Examples 1 through 21 to include, the first photovoltaic sub-cell including a single crystal base layer and a single crystal emitter layer, and the tunnel junction including a single crystal silicon layer and the II-VI semiconductor material layer comprising a single crystal, the single crystal emitter layer in contact with the single crystal silicon layer and the II-VI semiconductor material layer in contact with the multi-crystalline group II-VI semiconductor material base of the second photovoltaic sub-cell.

Example 23 can include, or can optionally be combined with the multijunction solar cell of one or any combination of Examples 1 through 22 to include, the first photovoltaic sub-cell including a single crystal base layer and a single crystal emitter layer, and the tunnel junction including a single crystal silicon layer and the II-VI semiconductor material layer comprising a multi-crystalline material, the single crystal emitter layer in contact with the single crystal silicon layer and the II-VI semiconductor material layer in contact with the multi-crystalline group II-VI semiconductor material base of the second photovoltaic sub-cell.

Example 24 can include, or can optionally be combined with the multijunction solar cell of one or any combination of Examples 1 through 23 to include, the first photovoltaic sub-cell including a multi-crystalline base layer and a multi-crystalline emitter layer, and the tunnel junction including a multi-crystalline silicon layer and the II-VI semiconductor material layer comprising a multi-crystalline material, the multi-crystalline emitter layer in contact with the multi-crystalline silicon layer and the II-VI semiconductor material layer in contact with the multi-crystalline group II-VI semiconductor material base of the second photovoltaic sub-cell.

Example 25 can include, or can optionally be combined with the multijunction solar cell of one or any combination of Examples 1 through 24 to include, a power conversion efficiency of the multijunction solar cell being between 19-27%, the power conversion efficiency associated with an one-sun illumination of the multijunction solar cell.

Example 26 can include, or can optionally be combined with the multijunction solar cell of one or any combination of Examples 1 through 25 to include, an open-circuit voltage of the multijunction solar cell being between 1.4-2 Volts.

Example 27 can include, or can optionally be combined with the multijunction solar cell of one or any combination of Examples 1 through 26 to include, a short-circuit current density of the multijunction solar cell being between 12-20 mA/cm$^2$.

Example 28 can include, or can optionally be combined with the multijunction solar cell of one or any combination of Examples 1 through 27 to include, at least one of the multi-crystalline group II-VI semiconductor material base and the multi-crystalline group II-VI semiconductor material emitter having a preferential crystal orientation.

Example 29 can include, or can optionally be combined with the multijunction solar cell of one or any combination of Examples 1 through 28 to include, an in-plane crystal orientation of at least one of the multi-crystalline group II-VI semiconductor material base and the multi-crystalline group II-VI semiconductor material emitter having a Gaussian distribution with a full width half maximum in a range of 0.04° to 60°.

Example 30 can include, or can optionally be combined with the multijunction solar cell of one or any combination of Examples 1 through 29 to include, an in-plane crystal orientation of at least one of the multi-crystalline group II-VI semiconductor material base and the multi-crystalline group II-VI semiconductor material emitter having a Gaussian distribution with a full width half maximum of at least 10°.

Example 31 can include, or can optionally be combined with the multijunction solar cell of one or any combination of Examples 1 through 30 to include, an in-plane crystal orientation of at least one of the multi-crystalline group II-VI semiconductor material base and the multi-crystalline group II-VI semiconductor material emitter having a Gaussian distribution with a full width half maximum of at least 45°.

Example 32 can include, or can optionally be combined with the multijunction solar cell of one or any combination of Examples 1 through 31 to include, an out-of-plane crystal orientation of at least one of the multi-crystalline group II-VI semiconductor material base and the multi-crystalline group II-VI semiconductor material emitter characterized by a texture component, $C_{hkl}$, that is greater than 0.3*n, where n is the total number of out-of-plane peaks.

Example 33 can include, or can optionally be combined with the multijunction solar cell of one or any combination of Examples 1 through 32 to include, an out-of-plane crystal orientation of at least one of the multi-crystalline group II-VI semiconductor material base and the multi-crystalline group II-VI semiconductor material emitter characterized by a texture component, $C_{hkl}$, that is greater than 0.5*n, where n is the total number of out-of-plane peaks.

Example 34 can include, or can optionally be combined with the multijunction solar cell of one or any combination of Examples 1 through 33 to include, an out-of-plane crystal orientation of at least one of the multi-crystalline group II-VI semiconductor material base and the multi-crystalline group II-VI semiconductor material emitter characterized by a texture component, $C_{hkl}$, that is greater than 0.8*n, where n is the total number of out-of-plane peaks.

Example 35 can include, or can optionally be combined with the subject matter of one or any combination of Examples 1 through 34 to include, a photovoltaic cell module or use of same comprising a frame configured to define an aperture area of the photovoltaic cell module for receiving light, and a plurality of multi junction solar cells positioned within the frame to receive the light. Wherein each of the multi junction solar cells includes: a first photovoltaic sub-cell comprising silicon, a tunnel junction provided over the first photovoltaic sub-cell, the tunnel junction including a II-VI semiconductor material layer having a band gap greater than 1.5 eV, and a second photovoltaic sub-cell provided over the tunnel junction, the second photovoltaic sub-cell including a multi-crystalline group II-VI semiconductor material base and a multi-crystalline group II-VI semiconductor material emitter having band gaps greater than 1.5 eV. And wherein a total surface area of the plurality of multi junction solar cells for receiving light comprises at least 50% of the aperture area.

Example 36 can include, or can optionally be combined with the subject matter of one or any combination of Examples 1 through 35 to include, the tunnel junction including a silicon layer provided below the II-VI semiconductor material layer, and wherein the total surface area comprises the total surface area of the multi-crystalline group II-VI semiconductor material emitter across all of the multi junction solar cells.

Example 37 can include, or can optionally be combined with the subject matter of one or any combination of Examples 1 through 36 to include, any of the II-VI semiconductor material layer, the multi-crystalline group II-VI semiconductor material base, or the multi-crystalline group II-VI semiconductor material emitter consisting of one or more of ZnTe, ZnSe, CdSe, CdTe, MgSe, and MgTe or alloys of one or more of ZnTe, ZnSe, CdSe, CdTe, MgSe, and MgTe.

Example 38 can include, or can optionally be combined with the subject matter of one or any combination of Examples 1 through 37 to include, a total surface area of at least one of the multi-crystalline group II-VI semiconductor material base and the multi-crystalline group II-VI semiconductor material emitter for receiving the light across all of the multi junction solar cells comprising at least 75% of the aperture area.

Example 39 can include, or can optionally be combined with the subject matter of one or any combination of Examples 1 through 38 to include, a total surface area of at least one of the multi-crystalline group II-VI semiconductor material base and the multi-crystalline group II-VI semiconductor material emitter for receiving the light across all of the multi junction solar cells comprising at least 90% of the aperture area.

Example 40 can include, or can optionally be combined with the subject matter of one or any combination of Examples 1 through 39 to include, a transparent front layer provided over the second photovoltaic sub-cell and a rear layer provided below the first photovoltaic sub-cell.

Example 41 can include, or can optionally be combined with the subject matter of one or any combination of Examples 1 through 40 to include, the transparent front layer comprising an encapsulant layer provided over the second photovoltaic sub-cell and a front support layer provided over the encapsulant layer.

Example 42 can include, or can optionally be combined with the subject matter of one or any combination of Examples 1 through 41 to include, the rear layer comprising a resin film layer provided below the first photovoltaic sub-cell and a rear support provided below the resin film layer.

Example 43 can include, or can optionally be combined with the subject matter of one or any combination of Examples 1 through 42 to include, a photovoltaic cell module or use of same, the photovoltaic cell module comprising a frame, a plurality of multi junction solar cells positioned within the frame, and at least one light concentrating apparatus provided over the plurality of multi junction solar cells, the light concentrating apparatus configured to concentrate incident light in a range of 2 to 50 times. Wherein each of the multi junction solar cells includes: a first photovoltaic sub-cell comprising silicon, a tunnel junction provided over the first photovoltaic sub-cell, the tunnel junction including a II-VI semiconductor material layer having a band gap greater than 1.5 eV, and a second photovoltaic sub-cell provided over the tunnel junction, the second photovoltaic sub-cell including a multi-crystalline group II-VI semiconductor material base and a multi-crystalline group II-VI semiconductor material emitter having band gaps greater than 1.5 eV.

Example 44 can include, or can optionally be combined with the subject matter of one or any combination of Examples 1 through 43 to include, the light concentrating apparatus configured to provide 2 to 50 times light concentration to each of the multi junction solar cells.

Example 45 can include, or can optionally be combined with the subject matter of one or any combination of Examples 1 through 44 to include, each of the multi junction solar cells coupled to a heat sink.

Example 46 can include, or can optionally be combined with the subject matter of one or any combination of Examples 1 through 45 to include, the light concentrating apparatus comprising one or more refractive or reflective optical components.

Example 47 can include, or can optionally be combined with the subject matter of one or any combination of Examples 1 through 46 to include, any of the II-VI semiconductor material layer, the multi-crystalline group II-VI semiconductor material base, or the multi-crystalline group II-VI semiconductor material emitter consisting of one or more of ZnTe, ZnSe, CdSe, CdTe, MgSe, and MgTe or alloys of one or more of ZnTe, ZnSe, CdSe, CdTe, MgSe, and MgTe.

Example 48 can include, or can optionally be combined with the subject matter of one or any combination of Examples 1 through 47 to include, a method comprising forming a first photovoltaic sub-cell comprising silicon, forming a tunnel junction over the first photovoltaic sub-cell, the forming of the tunnel junction including depositing a group II-VI material layer, and forming a second photovoltaic sub-cell over the tunnel junction, the forming of the second photovoltaic sub-cell including depositing a multi-crystalline group II-VI semiconductor material base over the tunnel junction and depositing a multi-crystalline group II-VI semiconductor material emitter over the multi-crystalline group II-VI semiconductor material base, wherein the base and emitter have band gaps greater than 1.5 eV.

Example 49 can include, or can optionally be combined with the subject matter of one or any combination of Examples 1 through 48 to include, any of the group II-VI material layer, the multi-crystalline group II-VI semiconductor material base, or the multi-crystalline group II-VI semiconductor material emitter consisting of one or more of ZnTe, ZnSe, CdSe, CdTe, MgSe, and MgTe or alloys of one or more of ZnTe, ZnSe, CdSe, CdTe, MgSe, and MgTe.

Example 50 can include, or can optionally be combined with the subject matter of one or any combination of Examples 1 through 49 to include, at least one of the group II-VI material layer, the multi-crystalline group II-VI semiconductor material base, and the multi-crystalline group II-VI semiconductor material emitter deposited using closed-space sublimation.

Example 51 can include, or can optionally be combined with the subject matter of one or any combination of Examples 1 through 49 to include, at least one of the group II-VI material layer, the multi-crystalline group II-VI semiconductor material base, and the multi-crystalline group II-VI semiconductor material emitter deposited using co-evaporation.

Example 52 can include, or can optionally be combined with the subject matter of one or any combination of Examples 1 through 49 to include, at least one of the group II-VI material layer, the multi-crystalline group II-VI semiconductor material base, and the multi-crystalline group II-VI semiconductor material emitter deposited using vapor transport deposition.

Example 53 can include, or can optionally be combined with the subject matter of one or any combination of Examples 1 through 49 to include, at least one of the group II-VI material layer, the multi-crystalline group II-VI semiconductor material base, and the multi-crystalline group II-VI semiconductor material emitter deposited using sputter deposition.

Example 54 can include, or can optionally be combined with the subject matter of one or any combination of Examples 1 through 53 to include, the forming of the first photovoltaic sub-cell comprising selectively doping a silicon wafer or thin film to form a base and an emitter.

In summary, several solar cell architectures including multi-crystalline group II-VI and Si photovoltaic sub-cells are described herein to achieve relatively high power conversion efficiencies at lower manufacturing cost for flat panel, low, and/or medium light concentration PV modules. In some embodiments, it is contemplated that one or more blocks of flow diagrams 600, 700, 800, 900 and/or 1300 is wholly or in part performed using robotics, a control computing system, or other automated fabrication equipment. The robotics, control computing system, or automated fabrication equipment includes one or more processors, memories, computer- or machine-executable instructions, sensors, user interface, and other components to automate fabrication of solar cells 400a, 400b, 400c, 410a and/or modules 500a, 500-FP, 500b, 500c.

Certain embodiments described herein may be implemented as logic or a number of modules, engines, components, or mechanisms. A module, engine, logic, component, or mechanism (collectively referred to as a "module") may be a tangible unit capable of performing certain operations and configured or arranged in a certain manner. In certain example embodiments, one or more computer systems (e.g., a standalone, client, or server computer system) or one or more components of a computer system (e.g., a processor or a group of processors) may be configured by software (e.g., an application or application portion) or firmware (note that software and firmware can generally be used interchangeably herein as is known by a skilled artisan) as a module that operates to perform certain operations described herein.

While example embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A monolithic, multijunction solar cell, comprising:
a first photovoltaic sub-cell;
a tunnel junction provided over the first photovoltaic sub-cell, the tunnel junction including a single crystal II-VI semiconductor material layer having a band gap greater than 1.5 eV; and
a second photovoltaic sub-cell provided over the tunnel junction, the second photovoltaic sub-cell including a multi-crystalline group II-VI semiconductor material base comprised of CdSe and a multi-crystalline group II-VI semiconductor material emitter having band gaps greater than 1.5 eV, wherein light incident on the monolithic, multijunction solar cell is received by the second photovoltaic sub-cell before the first photovoltaic sub-cell.

2. The multijunction solar cell of claim 1, wherein any of the single crystal II-VI semiconductor material layer, the multi crystalline group II-VI semiconductor base, or the multi-crystalline group II-VI semiconductor material emitter consists of one or more of ZnTe, ZnSe, CdSe, CdTe, MgSe, and MgTe or alloys of one or more of ZnTe, ZnSe, CdSe, CdTe, MgSe, and MgTe.

3. The multijunction solar cell of claim 1, wherein the multi-crystalline group II-VI semiconductor material base of the second photovoltaic sub-cell in contact with the tunnel junction comprises an n-type doped layer having an n-type dopant concentration between $10^{15}$ to $10^{19}$ $cm^{-3}$ and the multi-crystalline group II-VI semiconductor material emitter of the second photovoltaic sub-cell comprises a p-type doped layer having a p-type dopant concentration between $10^{15}$ to $10^{18}$ $cm^3$.

4. The multijunction solar cell of claim 1, wherein the multi-crystalline group II-VI semiconductor material base of the second photovoltaic sub-cell in contact with the tunnel junction comprises a p-type doped layer having a p-type dopant concentration between $10^{15}$ to $10^{18}$ $cm^3$ and the multi-crystalline group II-VI semiconductor material emitter of the second photovoltaic sub-cell comprises an n-type doped layer having an n-type dopant concentration between $10^{15}$ to $10^{19}$ $cm^{-3}$.

5. The multijunction solar cell of claim 1, wherein at least one of the multi-crystalline group II-VI semiconductor material base and the multi-crystalline group II-VI semiconductor material emitter has a thickness in a range of 50 nm to 8 μm.

6. The multijunction solar cell of claim 1, wherein a root mean square roughness factor of a thickness of the second photovoltaic sub-cell is in a range of 1% to 20%.

7. The multijunction solar cell of claim 1, wherein a root mean square roughness factor of a thickness of the second photovoltaic sub-cell is at least 1%.

8. The multijunction solar cell of claim 1, wherein at least one of the multi-crystalline group II-VI semiconductor material base, and the multi crystalline group II-VI semiconductor material emitter has a defect density in a range of $10^5$ cm$^{-2}$ to $10^{10}$ cm$^{-2}$.

9. The multijunction solar cell of claim 1, wherein the II-VI semiconductor material layer included in the tunnel junction has a lateral grain size greater than 1 μm and as large as 100 μm.

10. The multijunction solar cell of claim 1, wherein the first photovoltaic sub-cell comprises a wafer or thin film of silicon.

11. The multijunction solar cell of claim 10, wherein: the first photovoltaic sub-cell includes a single crystal base layer and a single crystal emitter layer; and the tunnel junction includes a single crystal silicon layer;
wherein the single crystal emitter layer of the first photovoltaic sub-cell is in contact with the single crystal silicon layer of the tunnel junction; and the single crystal II-VI semiconductor material layer of the tunnel junction is in contact with the multi-crystalline group II-VI semiconductor material base of the second photovoltaic sub-cell.

12. The multijunction solar cell of claim 1, wherein a power conversion efficiency of the multijunction solar cell is between 19-27%, the power conversion efficiency associated with an one-sun illumination of the multijunction solar cell.

13. The multijunction solar cell of claim 1, wherein an open-circuit voltage of the multijunction solar cell is between 1.4-2 Volts.

14. The multijunction solar cell of claim 1, wherein a short-circuit current density of the multijunction solar cell is between 12-20 mA/cm$^2$.

15. The multijunction solar cell of claim 1, wherein an in-plane crystal orientation of at least one of the multi-crystalline group II-VI semiconductor material base and the multi-crystalline group II-VI semiconductor material emitter has a Gaussian distribution with a full width half maximum in a range of 0.04° to 60°.

16. The multijunction solar cell of claim 1, wherein an in-plane crystal orientation of at least one of the multi-crystalline group II-VI semiconductor material base and the multi-crystalline group II-VI semiconductor material emitter has a Gaussian distribution with a full width half maximum of at least 10°.

17. The multijunction solar cell of claim 1, wherein at least one of the multi-crystalline group II-VI semiconductor material base and the multi-crystalline group II-VI semiconductor material emitter included in the second photovoltaic sub-cell has a lateral grain size in a range of 1 μm to 500 μm.

* * * * *